US008531093B2

(12) United States Patent
Shirasu et al.

(10) Patent No.: US 8,531,093 B2
(45) Date of Patent: *Sep. 10, 2013

(54) DISCHARGE LAMP, LIGHT SOURCE APPARATUS, EXPOSURE APPARATUS, AND EXPOSURE APPARATUS MANUFACTURING METHOD

(75) Inventors: Hiroshi Shirasu, Yokohama (JP); Yasuo Aoki, Zushi (JP); Motoo Koyama, Tokyo (JP); Takayuki Kikuchi, Zushi (JP)

(73) Assignee: Nikon Corporation, Tokyo (JP)

( * ) Notice: Subject to any disclaimer, the term of this patent is extended or adjusted under 35 U.S.C. 154(b) by 183 days.

This patent is subject to a terminal disclaimer.

(21) Appl. No.: 11/896,416

(22) Filed: Aug. 31, 2007

(65) Prior Publication Data

US 2008/0218049 A1    Sep. 11, 2008

(30) Foreign Application Priority Data

Sep. 1, 2006    (JP) ................ P2006-237252
Jan. 15, 2007    (JP) ................ P2007-006462
May 11, 2007    (JP) ................ P2007-127451

(51) Int. Cl.
*H01J 7/26* (2006.01)
*H01J 1/02* (2006.01)
*H01J 61/52* (2006.01)
*F21V 29/00* (2006.01)
*H01R 13/00* (2006.01)

(52) U.S. Cl.
USPC .............. 313/35; 313/46; 362/264; 439/190; 439/245; 439/375; 439/485; 439/616

(58) Field of Classification Search
USPC ................ 313/49–51, 317–318.12, 30, 33, 313/35, 36, 42, 43, 44, 46; 362/368, 264, 362/345, 373; 262/264, 345, 373; 439/190, 439/226–245, 253, 254, 375, 485, 577, 611–619
See application file for complete search history.

(56) References Cited

U.S. PATENT DOCUMENTS 2,520,262 A * 8/1950 Slooff .................... 174/15.3
5,025,192 A * 6/1991 Okamoto ................ 313/623

(Continued)

FOREIGN PATENT DOCUMENTS

EP    0947883 A2    10/1999
GB    359468 A    4/1930

(Continued)

OTHER PUBLICATIONS

Ueno, Machine translation of JP 2000/181075A.*

(Continued)

*Primary Examiner* — Nimeshkumar Patel
*Assistant Examiner* — Steven Horikoshi
(74) *Attorney, Agent, or Firm* — Finnegan, Henderson, Farabow, Garrett & Dunner, L.L.P.

(57) ABSTRACT

A light source apparatus is equipped with a discharge lamp, which has a glass tube that forms a light emitting part and a base member that is coupled thereto, and a mounting apparatus that holds the discharge lamp via the base member. Therein, the base member has a flange part that contacts positioning plate of the mounting apparatus, and a fixed part that is urged with a pressing force that presses the flange part to the positioning plate. Furthermore, the mounting apparatus has a fixing arm that urges the fixed part by a compression coil spring.

23 Claims, 17 Drawing Sheets

(56) References Cited

U.S. PATENT DOCUMENTS

| | | | |
|---|---|---|---|
| 5,465,025 A * | 11/1995 | Hendrickson | 313/318.09 |
| 5,493,168 A | 2/1996 | Seedorf | |
| 5,997,354 A * | 12/1999 | Fulop et al. | 439/615 |
| 6,369,876 B1 * | 4/2002 | Sato | 355/69 |
| 6,692,309 B1 * | 2/2004 | Kovacs | 439/699.2 |
| 6,703,769 B2 | 3/2004 | Yamane et al. | |
| 6,736,527 B1 * | 5/2004 | Gibbon et al. | 362/264 |
| 6,771,353 B2 | 8/2004 | Sato | |
| 6,778,257 B2 | 8/2004 | Bleeker et al. | |
| 2003/0001503 A1 * | 1/2003 | Higashimoto et al. | 313/631 |
| 2009/0033193 A1 * | 2/2009 | Zuk et al. | 313/42 |

FOREIGN PATENT DOCUMENTS

| | | |
|---|---|---|
| JP | 60-154435 | 8/1985 |
| JP | 04-032154 | 2/1992 |
| JP | A-05-028968 | 2/1993 |
| JP | 05-038752 | 5/1993 |
| JP | 09-213129 | 8/1997 |
| JP | 9-213129 | 8/1997 |
| JP | 10-055713 | 2/1998 |
| JP | 10-55713 | 2/1998 |
| JP | 11-283898 | 10/1999 |
| JP | 2000181075 A * | 6/2000 |
| JP | A-2001-216938 | 8/2001 |
| JP | 2003-17003 | 1/2003 |
| JP | 2003-045219 | 2/2003 |
| JP | 2003-45219 | 2/2003 |
| JP | 2003059454 A * | 2/2003 |
| JP | A 2003-297228 | 10/2003 |
| JP | 2007-103153 | 4/2007 |
| WO | WO99/49504 | 9/1999 |
| WO | WO2004/019128 | 3/2004 |

OTHER PUBLICATIONS

Matsushima et al., Machine translation of JP 2003/059454.*

Chinese Office Action dated May 6, 2010, issued for Chinese Patent Application No. 200780032265.8 with English translation thereof.

Intellectual Property Office of Singapore, Search and Examination Report of Singapore Patent Application No. 200901434-1, Nov. 23, 2010, 9 pages.

Office Action from the SIPO of the People's Republic of China, issued Dec. 15, 2010, in Chinese Patent Application No. 200780032265.8.

European Search Report issued on related European Patent Application No. 07806424.3, dated Oct. 20, 2010.

International search report issued on related PCT (PCT/JP2007/066947) with English translation, dated Nov. 20, 2007.

Written Opinion issued on related PCT/JP2007/066947 with English translation.

Office Action issued on the counterpart Taiwanese Patent Application No. 096132475 mailed Jun. 25, 2012 (29 pages).

Office Action for U.S. Appl. No. 13/462,454 dated Oct. 9, 2012 (11 pages).

Office Action issued on the counterpart Japanese Patent Application No. 2010-123636 mailed Sep. 18, 2012 and the English translation thereof. (9 pages).

Office Action issued on the counterpart Japanese Patent Application No. 2010-123637 mailed Sep. 18, 2012 and the English translation thereof. (7 pages).

Office Action issued by USPTO dated Jun. 12, 2013 for U.S. Appl. No. 13/462,454.

* cited by examiner

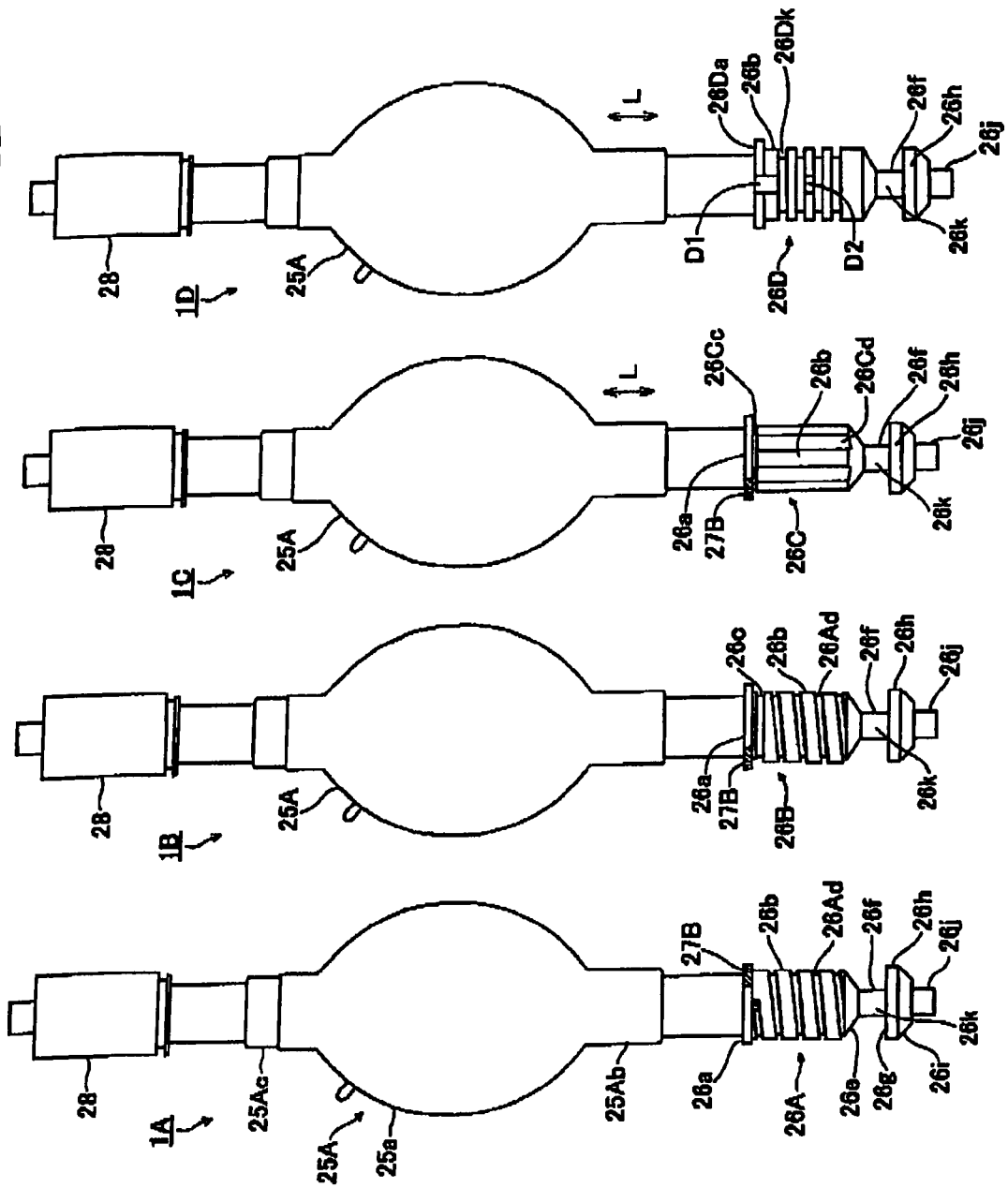

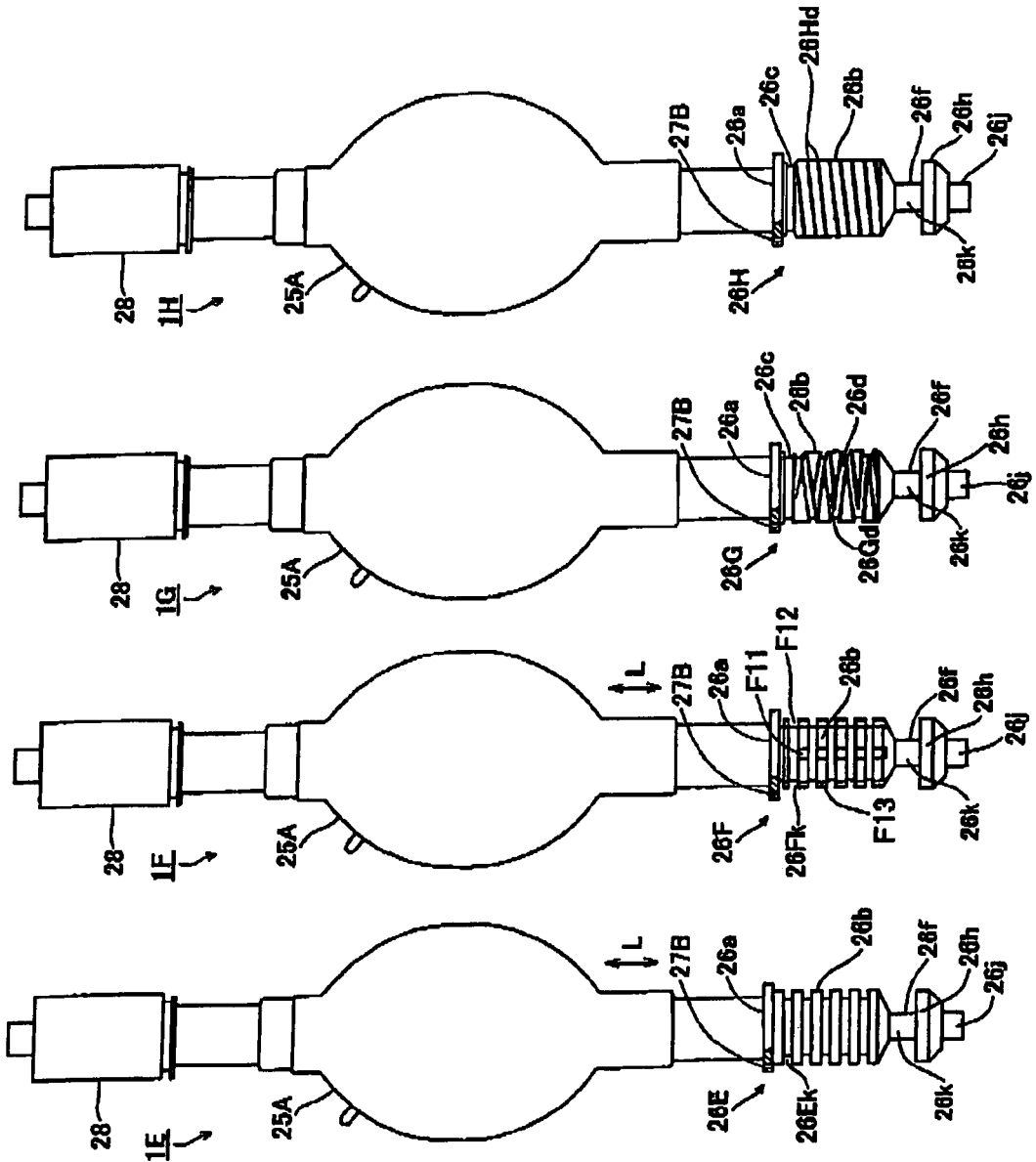

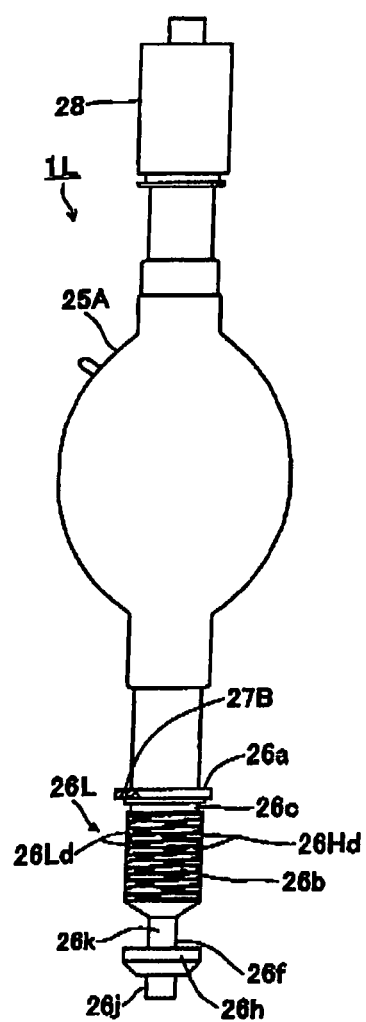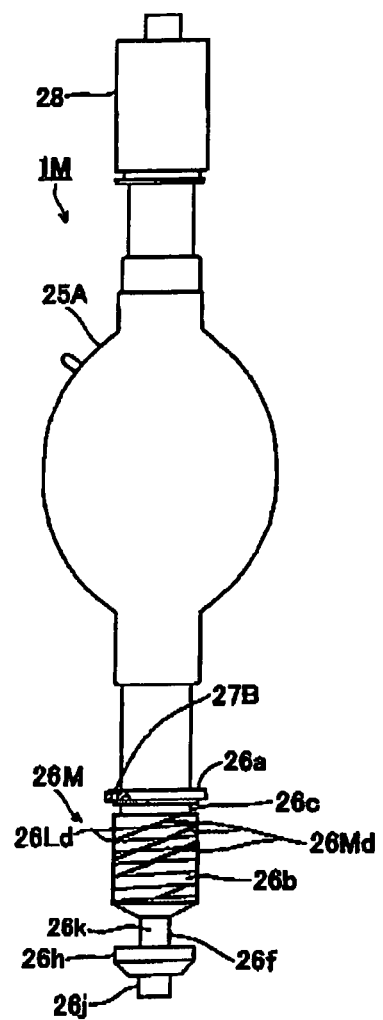

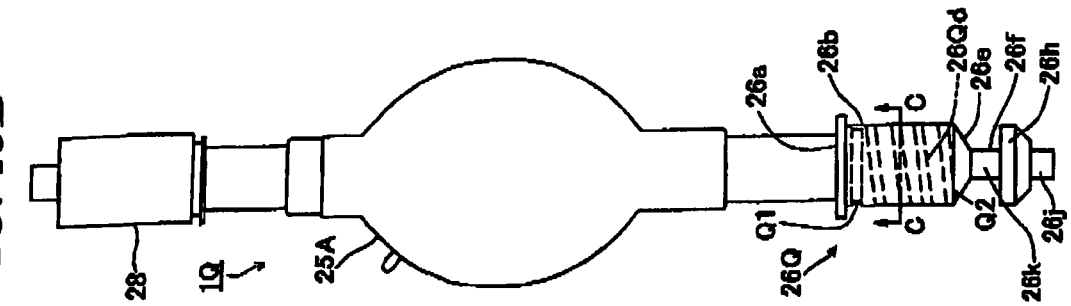
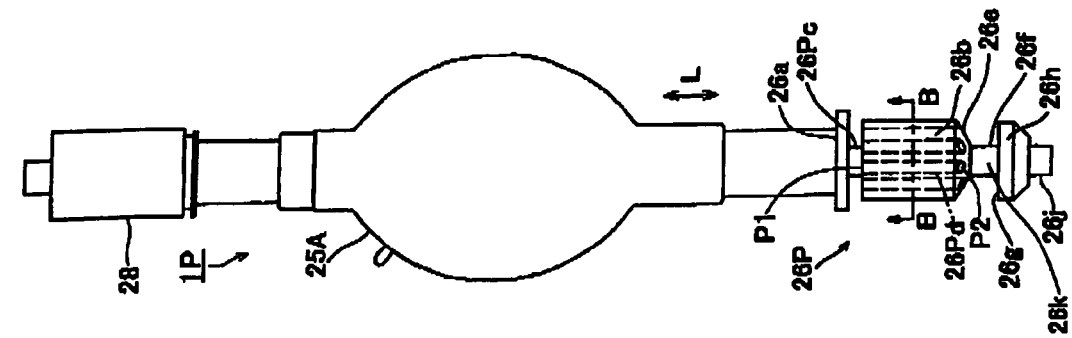
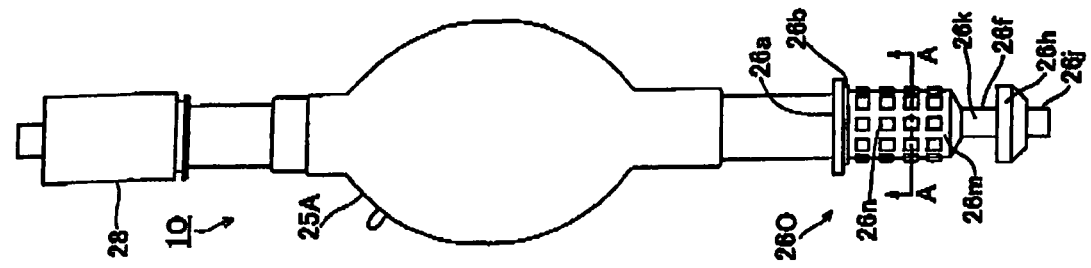
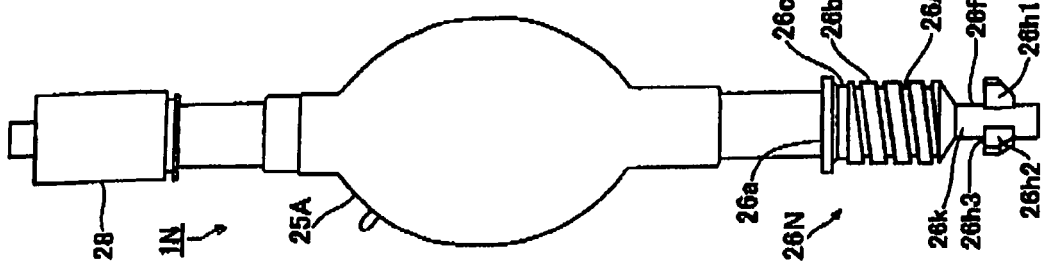

FIG. 16A
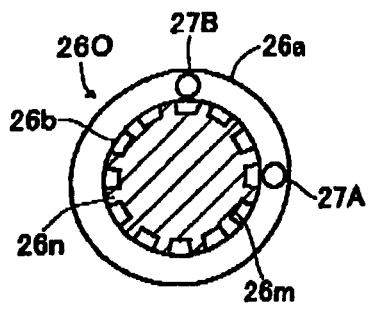
FIG. 16B
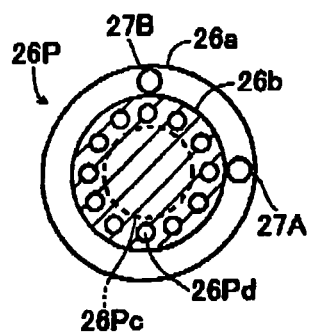
FIG. 16C
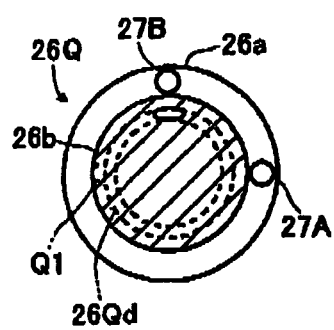
FIG. 17
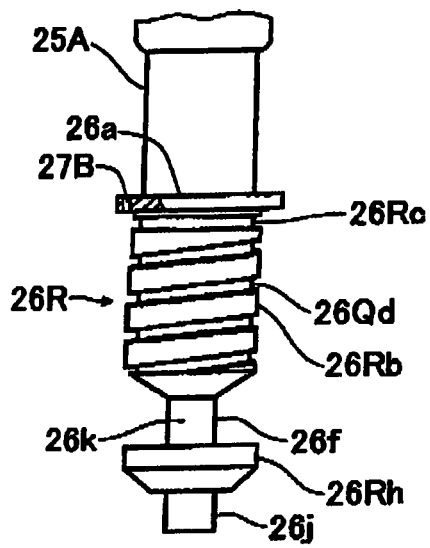
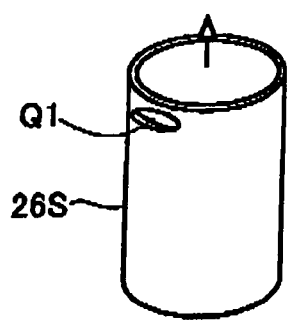

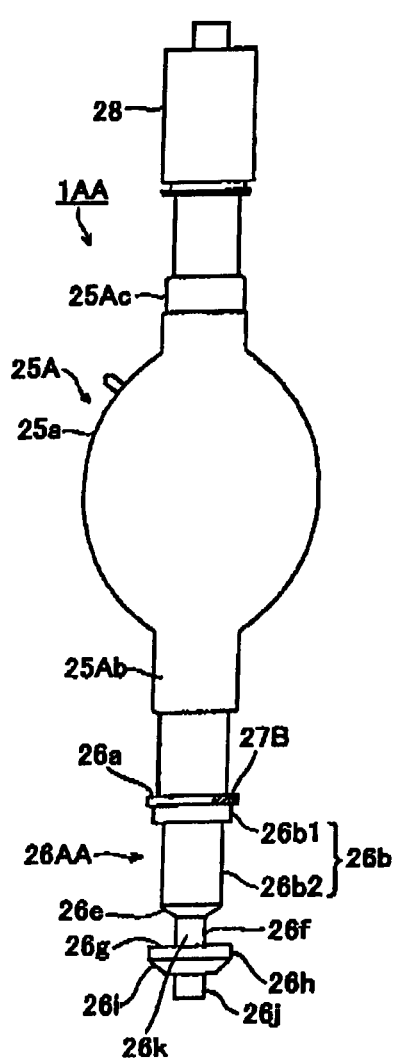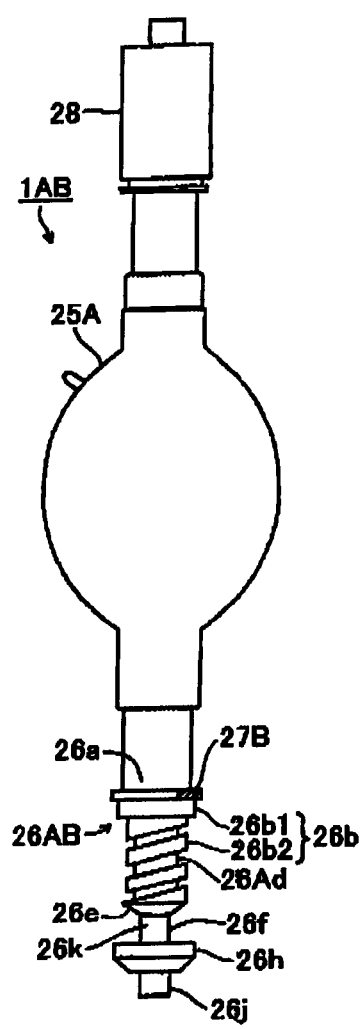

DISCHARGE LAMP, LIGHT SOURCE APPARATUS, EXPOSURE APPARATUS, AND EXPOSURE APPARATUS MANUFACTURING METHOD

CROSS-REFERENCE TO RELATED APPLICATION

This application is a non-provisional application that claims priority to Japanese Patent Application Nos. 2006-237252, filed on Sep. 1, 2006, 2007-006462, filed on Jan. 15, 2007, and 2007-127451, filed on May 11, 2007, the contents of which are incorporated herein by reference.

BACKGROUND OF THE INVENTION

1. Field of the Invention

The present invention relates to a discharge lamp, a light source apparatus that is equipped with this discharge lamp, and an exposure apparatus that is equipped with this light source apparatus.

2. Description of Related Art

An exposure apparatus, such as a full field exposure type (stationary exposure type) projection exposure apparatus (e.g., a stepper) or a scanning exposure type projection exposure apparatus (e.g., a scanning stepper) that transfers a pattern formed on a reticle (or a photomask and the like) to a wafer (or a glass plate and the like) that is coated with a resist, is used in a lithographic process for fabricating various devices (such as microdevices and electronic devices). An exposure light source apparatus that comprises a combination of a discharge lamp, such as a mercury lamp, and a condenser mirror is conventionally used in such an exposure apparatus, and that discharge lamp is held via a prescribed mounting mechanism.

In one example of a conventional discharge lamp mounting mechanism, a flange part and a ring shaped groove part are provided to a base of the discharge lamp, an open part of a leaf spring is engaged with the groove part, and the flange part is pressed against and fixed to a bracket by that leaf spring (e.g., refer to Japanese Unexamined Patent Application, Publication No. H10-55713). When mounting or replacing a discharge lamp with this mechanism, it is necessary to slide the leaf spring so that a clamp mechanism thereof can be loosened and the open part of the leaf spring can pass through the base. In addition, in another example of a conventional discharge lamp mounting mechanism, a positioning pin or the like is provided to the base of the discharge lamp in advance, the base is fixed by inserting it into a circular open part, which is provided in a flat plate shaped mounting plate, at a prescribed rotational angle and then tightening a slotted part, which is provided in the open part, with a bolt (e.g., refer to Japanese Unexamined Patent Application, Publication No. 2003-45219).

In addition, among conventional light source apparatuses that have a discharge lamp, there is a type that comprises a cooling mechanism for reducing the effects of heat generation. In one example of a conventional cooling mechanism, cooled air is supplied from an outer surface of one base of the discharge toward an outer surface of another base via an outer surface of a bulb part (e.g., refer to Japanese Unexamined Patent Application, Publication No. H09-213129). In another example of a known conventional cooling mechanism, a ring shaped groove part is provided to a base of a discharge lamp, and cooled air is supplied to a bulb part via the groove part and a prescribed ventilation pipe (e.g., refer to Japanese Unexamined Patent Application, Publication No. H11-283898).

With the discharge lamp mounting mechanism in a conventional light source apparatus, when mounting or replacing the discharge lamp, it is necessary either to loosen the clamp mechanism of the leaf spring and slide the leaf spring, or to loosen the clamp of the mounting plate slotted part, and consequently there is a problem in that it takes time, for example, to mount the discharge lamp. In addition, with the conventional mounting mechanism, the base of the discharge lamp is fixed either by engaging one part of the contour of the open part provided to the leaf spring with the groove part of the base, or by tightening the slotted part of the mounting plate, and consequently there is a problem in that it is difficult to set the force by which the base is fixed so that it falls within a target range.

In addition, with the discharge lamp cooling mechanism in the conventional light source apparatus, a cold blast is blown principally against the bulb part of the discharge lamp, and consequently there is a problem in that the cooling action with respect to the base is small.

A first object of the present invention to provide a light source apparatus wherein it is possible, for example, to mount a discharge lamp to a mounting mechanism easily in a short amount of time, as well as to make it possible to easily set.

In addition, it is a second object of the present invention to provide a light source apparatus wherein it is possible to cool the discharge lamp efficiently with a simple mechanism.

It is yet another object of the present invention to provide a discharge lamp that can be adapted to such a light source apparatus, and exposure technology wherein that light source apparatus is used.

SUMMARY OF THE INVENTION

A light source apparatus according to a first aspect of the present invention comprises: a discharge lamp, which comprises a glass member that forms a light emitting part and a base member that is coupled to the glass member; and a holding apparatus, which comprises a holding member that holds the discharge lamp via the base member; wherein the base member comprises: a contact part that contacts the holding member and defines a position of the light emitting part with respect to the holding member in a first direction; an urged part, which is urged by a pressing force that presses the contact part to the holding member in the first direction; a mating part that is provided between the contact part and the urged part and that mates with the holding member; and a groove part that is provided in the mating part and that, along with the holding member, constitutes a cooling medium conduit that extends from the vicinity of the contact part to the urged part; and the holding apparatus comprises: the holding member; an urging member that urges the urged part with the pressing force; a switching mechanism that switches between pressing the contact part to the holding member by the urging member and releasing the pressing; and a medium supply apparatus that supplies the medium, which is for cooling the base member, to the conduit via the groove part.

A light source apparatus according to a second aspect of the present invention comprises: a discharge lamp, which comprises a glass member that forms a light emitting part and a base member that is coupled to the glass member; and a holding apparatus, which comprises a holding member that holds the discharge lamp via the base member; wherein the base member comprises: a contact part that contacts the holding member and defines a position of the light emitting part in the first direction with respect to the holding member; an urged part that is urged by the contact part with a pressing force that presses it to the holding member in the first direction; a defining part that is provided between the contact part and the urged part and that defines a position of the light emitting part with respect to the holding member in a direction that is orthogonal to the first direction; and a cooling part that is provided between the contact part and the urged part and that, along with the holding member, constitutes a conduit, which extends from the vicinity of the contact part to the urged part, for a cooling medium; and the holding apparatus comprises; the holding member; an urging member that urges the urged part with the pressing force; a switching mechanism that switches between the pressing and releasing the pressing by the urging member of the contact part to the holding member; and a medium supply apparatus that supplies the cooling medium, which is for cooling the base member, to the conduit.

A discharge lamp according to a third aspect of the present invention is a discharge lamp that comprises: a glass member that forms a light emitting part; and a base member that is coupled to the glass member and is detachably held by a holding member; wherein the base member comprises: a contact part that contacts the holding member and defines a position of the light emitting part with respect to the holding member in a first direction; an urged part, which is urged by a pressing force that presses the contact part to the holding member in the first direction; a mating part that is provided between the contact part and the urged part and that mates with the holding member; and a groove part that is provided in the mating part and that, along with the holding member, constitutes a cooling medium conduit that extends from the vicinity of the contact part to the urged part.

A discharge lamp according to a fourth aspect of the present invention is a discharge lamp that comprises: a glass member that forms a light emitting part; a first base member that is coupled to the glass member and is detachably held by a holding member; and a second base member that is coupled to the glass member at a position that is separate from the first base member; wherein the first base member comprises: a contact part that contacts the holding member and defines the position of the light emitting part in a first direction with respect to the holding member; a mating part that is provided on the opposite side of the glass member in the first direction with respect to the contact part and that mates with the holding member; and a groove part that is provided in the mating part and that, along with the holding member, constitutes a cooling medium conduit; and the second base member comprises a conduit through which a cooling medium that cools the second base member flows.

A discharge lamp according to a fifth aspect of the present invention is a discharge lamp that emits light by electric discharge between first and second electrodes that are spaced apart from one another, comprising: a first base member that is connected to the first electrode; and a second base member that is connected to the second electrode; wherein, a first conduit, through which a cooling medium that cools the first base member flows, is formed in the first base member; and a second conduit, through which a cooling medium that cools the second base member flows, is formed in the second base member.

A discharge lamp according to a sixth aspect of the present invention comprises: a glass member that forms a light emitting part; and a base member that comprises: a contact part that is coupled to a first direction side of the glass member and that extends in a second direction that is orthogonal to the first direction; an urged part that is urged by a force in the first direction; a mating part that is provided between the contact part and the urged part; and a groove part that is provided in the mating part, wherein the base member defines a position of the light emitting part in the first direction by contacting the contact part by the application of a force that is urged upon the urged part in the first direction as well as a position in a direction that is orthogonal to the first direction by mating with the mating part, and can be held by a holding apparatus that supplies a cooling medium to a conduit formed between the holding member and the groove part.

A discharge lamp according to a seventh aspect of the present invention is a discharge lamp that comprises: a glass member that forms a light emitting part; and a base member that is coupled to the glass member and is detachably held by a holding member, wherein the base member comprises: a contact part that contacts the holding member and defines a position of the light emitting part with respect to the holding member in a first direction; an urged part, which is urged by a pressing force that presses the contact part to the holding member in the first direction; a mating part that is provided between the contact part and the urged part and that mates with the holding member; and a fluid path that comprises a cooling medium conduit that is provided between the vicinity of the contact part and the urged part so that it passes through the interior of the mating part.

A light source apparatus according to an eighth aspect of the present invention is a light source apparatus that comprises: the discharge lamp according to the fifth aspect of the present invention; and a holding apparatus that comprises the holding member that holds the discharge lamp via the base member; wherein the holding apparatus comprises: an urging member that urges the urged part with the pressing force; and a medium supply apparatus that supplies a medium, which is for cooling the base member, to the fluid path.

A discharge lamp according to a ninth aspect of the present invention is a discharge lamp that comprises: a glass member that forms a light emitting part; and a base member that couples with the glass member; wherein in sequence in the direction away from the glass member along a first axis that is parallel to a first direction, the base member comprises: a contact part that has a shape that includes a discoidal shape, which is centered on the first axis and has a radius that is greater than or equal to a first radius; a mating part that has a shape such that it is circumscribed by a columnar shape, which is centered on the first axis and has a second radius that is smaller than the first radius; a small diameter part that has a shape that includes a columnar shape, which is centered on the first axis and has a third radius that is smaller than the second radius; and an urged part that has a shape that includes a discoidal shape, which is centered on the first axis and has a fourth radius that is smaller than the first radius and larger than the third radius; and the base member has a solid body structure, which is for increasing the surface area of the mating part that contacts the air, at the outer circumference or in the vicinity of the mating part.

A discharge lamp according to a tenth aspect of the present invention is a discharge lamp, comprises: a glass member that comprises a light emitting part and that is formed so that it extends in a first direction; and a first base member, wherein one end part is coupled to an end part of the glass member on the first direction side; wherein the first base member comprises: a projecting part that protrudes in an orthogonal direction, which is orthogonal to the first direction; a first shaft part, which is provided between the projecting part and another end part of the first base member, the external shape of which is smaller than that of the projecting part in the orthogonal direction; a second shaft part, which is provided between the projecting part and the other end part of the first base member, the external shape of which is smaller than that of the first shaft part in the orthogonal direction; a third shaft part, which is provided between the projecting part and the other end part of the first base member, the external shape of which is smaller than that of the projecting part and larger than that of the second shaft part in the orthogonal direction; and a cooling part that is provided to at least part of an outer circumferential surface of the first shaft part and that is capable of contacting a cooling medium.

A discharge lamp according to an eleventh aspect of the present invention comprises: a glass member that forms a light emitting part; and a base member that is coupled to the glass member and is attachable and detachable to and from a holding member; wherein the base member comprises: a contact part that contacts the holding member and defines a position of the light emitting part with respect to the holding member in a first direction; an urged part, which is urged by a pressing force that presses the contact part to the holding member in the first direction; a mating part that is provided between the contact part and the urged part and that mates with the holding member; and a cooling part that is provided between the contact part and the urged part and that, along with the holding member, constitutes a cooling medium conduit that extends from the vicinity of the contact part to the urged part.

A discharge lamp according to a twelfth aspect of the present invention comprises: a glass member that forms a light emitting part; a first base member that is coupled to the glass member an is attachable and detachable to and from a holding member; and a second base member that is coupled to the glass member at a position that is different from that of the first base member; wherein the first base member comprises: a contact part that contacts the holding member and defines a position of the light emitting part with respect to the holding member in a first direction; a mating part that is provided on the opposite side of the glass member in the first direction with respect to the base member and that mates with the holding member; and a first conduit through which a cooling medium conduit flows is constituted along with the holding member; and the second base member comprises a second conduit through which a cooling medium that cools the second base member flows.

An exposure apparatus according to a thirteenth aspect of the present invention is an exposure apparatus that exposes a pattern on a photosensitive substrate by using exposure light generated by a light source apparatus, wherein a light source apparatus of the present invention is used as the light source apparatus.

A method of manufacturing a projection exposure apparatus according to a fourteenth aspect of the present invention is a method of manufacturing a projection exposure apparatus wherein light generated by a discharge between two electrodes of a discharge lamp is used to expose a photosensitive substrate with a pattern that comprises: a step that mounts the discharge lamp to a holding apparatus, which is for holding the discharge lamp, via a first base member that is provided so that it corresponds to one of the two electrodes of the discharge lamp; a step that connects a service cable to a second base member that is provided so that it corresponds to the other electrode of the discharge lamp; and a step that cools the first base member of the mounted discharge lamp in a state wherein such is mounted to the holding apparatus.

According to some aspect of the present invention, the discharge lamp of the present invention can be easily incorporated in the exposure apparatus.

BRIEF DESCRIPTION OF THE DRAWINGS

FIG. 11A is partial cutaway view that shows other embodiment of the discharge lamp according to the present invention.

FIG. 11B is partial cutaway view that shows other embodiment of the discharge lamp according to the present invention.

FIG. 11C is partial cutaway view that shows other embodiment of the discharge lamp according to the present invention.

FIG. 11D is partial cutaway view that shows other embodiment of the discharge lamp according to the present invention.

FIG. 12A is partial cutaway view that shows other embodiment of the discharge lamp according to the present invention.

FIG. 12B is partial cutaway view that shows other embodiment of the discharge lamp according to the present invention.

FIG. 12C is partial cutaway view that shows other embodiment of the discharge lamp according to the present invention.

FIG. 12D is partial cutaway view that shows other embodiment of the discharge lamp according to the present invention.

FIG. 14A is partial cutaway view that shows other embodiments of the discharge lamp according to the present invention.

FIG. 14B is partial cutaway view that shows other embodiments of the discharge lamp according to the present invention.

FIG. 15A shows other embodiment of the discharge lamp according to the present invention.

FIG. 15B shows other embodiment of the discharge lamp according to the present invention.

FIG. 15C shows other embodiment of the discharge lamp according to the present invention.

FIG. 15D shows other embodiment of the discharge lamp according to the present invention.

FIG. 16A is a cross sectional view that is taken along the A-A line in FIG. 15B.

FIG. 16B is a cross sectional view that is taken along the B-B line in FIG. 15C.

FIG. 16C is a cross sectional view that is taken along the C-C line in FIG. 15D.

FIG. 17 is an oblique view of the principal parts of the discharge lamp shown in FIG. 15D and shows one example of a method of manufacturing the same.

FIG. 18A shows yet another embodiment of the discharge lamp according to the present invention.

FIG. 18B shows yet another embodiment of the discharge lamp according to the present invention.

DESCRIPTION OF THE PREFERRED EMBODIMENTS

The following explains a preferred embodiment of the present invention, referencing FIG. 1 through FIG. 10B.

Figure 1:
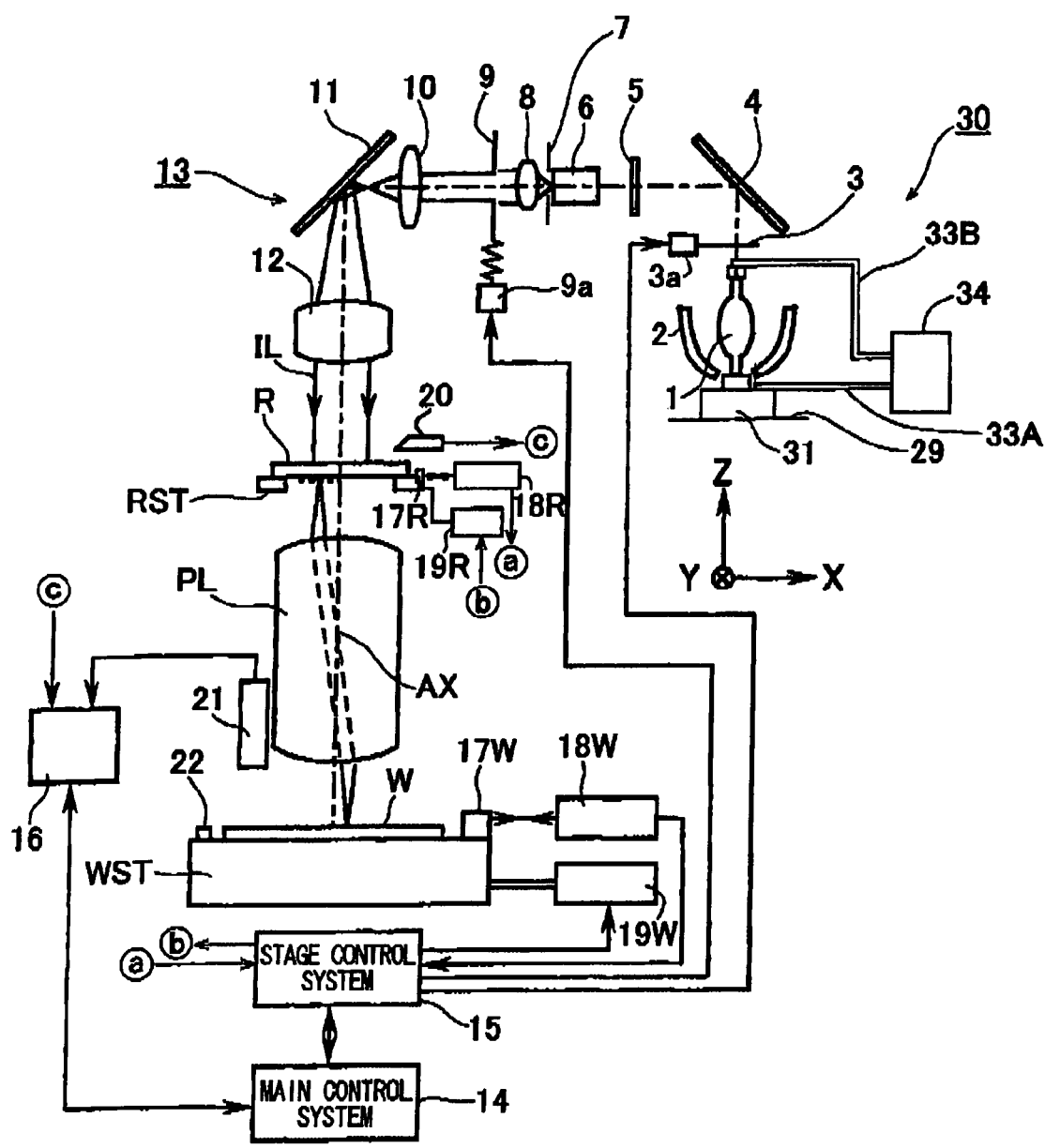
FIG. 1 is a schematic block diagram of a projection exposure apparatus according to one embodiment of the present invention.

FIG. 1 shows a projection exposure apparatus (exposure apparatus), which comprises an exposure light source 30 (light source apparatus) of the present embodiment; in FIG. 1, a discharge lamp 1, which comprises an arc discharge type mercury lamp, is fixed to a fixed plate 29 in an insulated state via a mounting apparatus 31 (holding apparatus). In addition, a cathode and an anode of the discharge lamp 1 are connected to a power supply 34 via flexible electric power cables 33A, 33B, and an elliptical mirror 2 (condenser mirror) is fixed to a bracket (not shown) so that it surrounds a bulb part of the discharge lamp 1. A light emitting part inside the bulb part of the discharge lamp 1 is disposed in, for example, the vicinity of a first focal point of the elliptical mirror 2. The exposure light source 30 comprises the discharge lamp 1, the elliptical mirror 2, the mounting apparatus 31, the electric power cables 33A, 33B, and the power supply 34 (discussed later in detail).

A light beam emitted from the discharge lamp 1 is converged in the vicinity of a second focal point by an elliptical mirror 2, after which it passes through the vicinity of a shutter 3, which changes the light beam to divergent light, and then impinges a mirror 4 that folds the optical path. The shutter 3 is opened and closed by a shutter drive apparatus 3a. The shutter drive apparatus 3a is controlled by a shutter control system not shown in figures. In the present embodiment, a stage control system 15, which is discussed later, controls the shutter drive apparatus 3a based on an instruction from a main control system 14, which provides supervisory control of the operation of the entire apparatus. The light beam reflected by the mirror 4 enters an interference filter 5, which selects just exposure light IL that comprises a prescribed bright line (e.g., the i-line, which has a 365 nm wavelength). Furthermore, in addition to the i-line, it is possible to use the g-line, the h-line, light that combines such lines, or, for example, a bright line from a lamp other than a mercury lamp as the exposure light IL. The selected exposure light IL enters a fly-eye lens 6 (optical integrator), and numerous secondary light sources are formed on a variable aperture stop 7, which is disposed at the emergent surface of the fly-eye lens 6. The exposure light IL that passes through the variable aperture stop 7 then enters a reticle blind (variable field stop) 9 via a first relay lens 8. The plane in which the reticle blind 9 is disposed is substantially conjugate with a pattern surface of a reticle R, and an illumination area on the reticle R is defined by setting the shapes of the openings of the reticle blind 9 via a drive apparatus 9a. In addition, the configuration is such that the stage control system 15 can open and close the reticle blind 9 via the drive apparatus 9a so that a wafer W is not unnecessarily irradiated with exposure light when, for example, the wafer W is stepped.

The exposure light IL that passes through the reticle blind 9 illuminates a pattern area of the pattern surface of the reticle R via a second relay lens 10, a dichroic mirror 11 that reflects the exposure light IL, and a condenser lens 12. The illumination optical system 13 comprises the shutter 3, the mirror 4, the interference filter 5, the fly-eye lens 6, the variable aperture stop 7, the relay lenses 8, 10, the reticle blind 9, the dichroic mirror 11, and the condenser lens 12. The light beam from the exposure light source 30, which serves as the exposure light IL, illuminates the reticle R (mask) via the illumination optical system 13, and one shot region of the wafer W (photosensitive substrate), which is coated with photoresist, is exposed at a projection magnification β (β is, for example, ¼ or ⅕) with the pattern inside the pattern area of the reticle R via a projection optical system PL. In the explanation below, the Z axis is parallel to an optical axis AX of the projection optical system PL, the X axis is parallel to the paper surface of FIG. 1 within a plane that is perpendicular to the Z axis, and the Y axis is perpendicular to the paper surface in FIG. 1.

At this time, the reticle R is held on a reticle stage RST, which is finely movable in the X and Y directions and in the rotational directions around the Z axis, on a reticle base (not shown). The position of the reticle stage RST is measured with high accuracy by a laser interferometer 18R that irradiates a movable mirror 17R, which is fixed to the reticle stage RST, with a measuring laser beam, and that measured value is supplied to the stage control system 15 and the main control system 14. Based on that measured value and control information from the main control system 14, the stage control system 15 controls the position of the reticle stage RST via a drive system 19R, which comprises a linear motor, etc.

Moreover, the wafer W is held on a wafer stage WST via a wafer holder (not shown), and the wafer stage WST is mounted on a wafer base (not shown) so that it is freely movable in the X and Y directions. The position of the wafer stage WST is measured with high accuracy by a laser interferometer 18W that irradiates a movable mirror 17W, which is fixed to the wafer stage WST, with a measuring laser beam, and that measured value is supplied to the stage control system 15 and the main control system 14. Based on that measured value and control information from the main control system 14, the stage control system 15 controls the position of the wafer stage WST (wafer W) via a drive system 19W, which comprises a linear motor, etc.

When exposing the wafer W, a step-and-repeat system repetitively performs: an operation wherein the wafer stage WST moves a shot region of the wafer W into the exposure field of the projection optical system PL; and an operation wherein the reticle R is irradiated with the light beam from the exposure light source 30 via an illumination optical system 13 and the relevant shot region on the wafer W is exposed with the pattern of the reticle R via the projection optical system PL. Thereby, the image of the pattern of the reticle R is transferred to each shot region on the wafer W.

Furthermore, in order to perform alignment beforehand when performing an exposure, a reticle alignment microscope 20 that detects the position of an alignment mark formed in the reticle R is installed above the reticle R, and an alignment sensor 21 that detects the position of an alignment mark, which is accessorily provided to each shot region on the wafer W, is installed on a side surface of the projection optical system PL. In addition, a fiducial mark member 22, wherein a plurality of fiducial marks is formed for the alignment sensor 21 and the like, is provided in the vicinity of the wafer W on the wafer stage WST. The detection signals of the reticle alignment microscope 20 and the alignment sensor 21 are supplied to an alignment signal processing system 16, which derives the array coordinates of the detected mark by, for example, performing image processing on the detection signals, and this array coordinate information is supplied to the main control system 14. The main control system 14 aligns the reticle R and the wafer W based on the array coordinate information.

The following explains the details of, for example, the configuration of the discharge lamp 1 and the mounting apparatus 31, which constitute the exposure light source 30 of the projection exposure apparatus of the present embodiment.

Figure 2A:
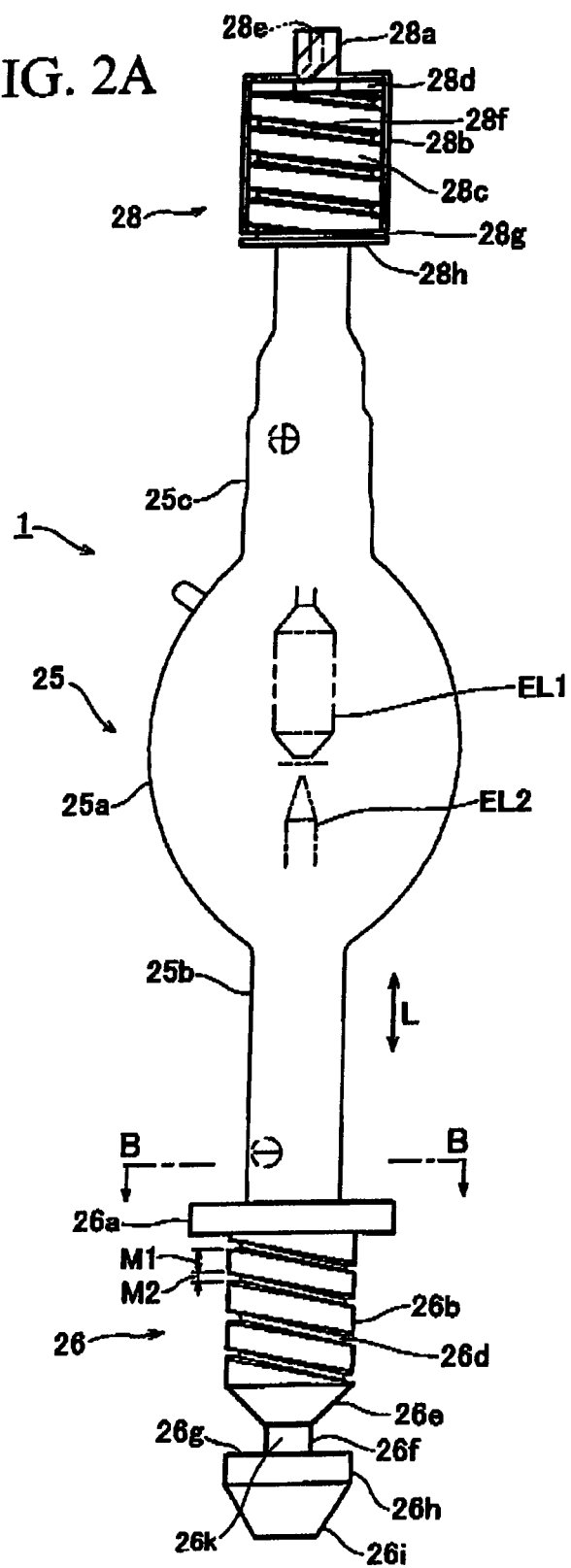
FIG. 2A is a partial cutaway view that shows a discharge lamp in FIG. 1.

FIG. 2A is a partial cutaway view that shows the discharge lamp 1 in the exposure light source 30 of FIG. 1; in FIG. 2A, the discharge lamp 1 comprises: a glass tube 25, which comprises a bulb part 25a and two substantially symmetric cylindrical rod shaped parts 25b, 25c that are fixed so that they sandwich the bulb part 25a; a base part (lamp base or metal base) 26, which is coupled to an end part of the rod shaped part 25b; and a base part 28 that is coupled to an end part of the rod shaped part 25c, the diameter of which decreases toward its outer side in steps. A cathode EL2 and an anode EL1, which form the light emitting part in the bulb part 25a, are opposingly fixed and are connected to the base parts 26, 28, respectively; in addition, the base parts 26, 28 are made of a metal that has satisfactory electrical and thermal conductivity. The base part 26, the glass tube 25, and the base part 28 are disposed along a straight line that passes through the center of the light emitting part so that the center axes of the rod shaped parts 25b, 25c of the glass tube 25 are links. The directions that are parallel to the straight line that links the center axes of the rod shaped parts 25b, 25c are longitudinal direction L of the discharge lamp 1.

The base parts 26, 28 basically are used as electric power receiving terminals for supplying electric power from the power supply 34 in FIG. 1 to the cathode EL2 and the anode EL1 via the electric power cables 33A, 33B, respectively. In addition, the base part 26 is also used as a held part so that the glass tube 25 (discharge lamp 1) can be held, and grooves are formed in both base parts 26, 28 where through a gas flows in order to dissipate the heat that is conducted from the glass tube 25.

Namely, in sequence from the rod shaped part 25b to the open end side, the following parts are formed in the base part 26, which is connected to the cathode EL2: an annular flange part 26a (contact part), which has an outer diameter that is approximately twice that of the rod shaped part 25b; a columnar shaft part 26b (mating part (defining part)), which has an outer diameter that is slightly larger than that of the rod shaped part 25b; a columnar small diameter part 26k, which has an outer diameter that is smaller than that of the shaft part 26b; and a columnar fixed part 26h, which has an outer diameter that is slightly smaller than that of the shaft part 26b or that has an external shape that is substantially the same as that of the shaft part 26b; furthermore, a chamfer part 26e is formed at the border between the shaft part 26b and the small diameter part 26k, and a chamfer part 26i is formed on the open end side of the fixed part 26h. Alternatively, the columnar shaft part 26b can have a substantially the same diameter as that of the rod shape part 25b. The small diameter part 26k is formed by providing a recessed part (stepped part) 26f between the shaft part 26b and the fixed part 26h in the directions that are orthogonal to the longitudinal direction L of the discharge lamp 1. When attaching the discharge lamp 1 to the mounting apparatus 31 in FIG. 1, the flange part 26a contacts a corresponding member and constitutes a reference for positioning the light emitting part of the glass tube 25 in the longitudinal direction L (first direction); furthermore, the shaft part 26b mates with an opening of the corresponding member and constitutes a reference for positioning the light emitting part in a plane that is orthogonal to the longitudinal direction L. In addition, a pressed surface 26g is provided on the fixed part 26h by forming the recessed part 26f. The pressed surface 26g lies in a plane that is orthogonal to the longitudinal direction L. When the discharge lamp 1 is held by the mounting apparatus 31 in FIG. 1, at least one of the members of an urging mechanism on the mounting apparatus 31 side is inserted into the recessed part 26f side, and that member applies a pressing force against the pressed surface 26g in the longitudinal direction L that is toward the open end side of the base part 26. Accordingly, the chamfer part 26e, the recessed part 26f, the pressed surface 26g, and the fixed part 26h form the members that are urged by the urging mechanism.

Figure 2B:
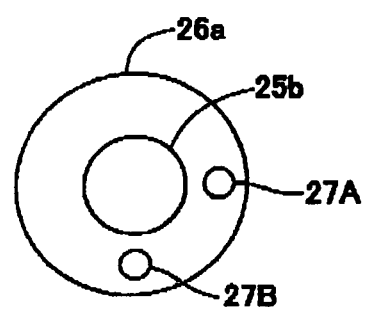
FIG. 2B is a cross sectional view taken along the B-B line in FIG. 2A.
Figure 2C:
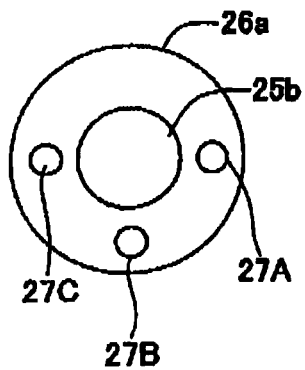
FIG. 2C shows an example of another configuration of FIG. 2B.

FIG. 2B is a cross sectional view of the discharge lamp 1 in FIG. 2A taken along the B-B line; as shown in FIG. 2B, openings 27A, 27B (positioning parts) are formed at, for example, 90° intervals at two locations in the flange part 26a. The discharge lamp 1 is positioned around its axis along the longitudinal direction L by inserting two corresponding pins 70A, 70B (refer to FIG. 4) on the side of the mounting apparatus 31 in the openings 27A, 27B. That is, with respect to the mounting apparatus 31, the rotation angle of the discharge lamp 1 around the longitudinal direction L of the discharge lamp 1 is determined. In addition, there are multiple types of discharge lamps 1 that each have different light emitting power and the like, and therefore the number and/or angle and the like of the openings 27A, 27B differ for each discharge lamp type. Accordingly, there may be one or more openings. Specifically, as shown in FIG. 2C, openings 27A, 27B, 27C are formed at, for example, 90° intervals at three locations in the flange part 26a of a discharge lamp that is of a different type than that of FIG. 2B, and three pins are formed in a corresponding mounting apparatus. This reliably prevents the mounting of a discharge lamp of a different specification in the mounting apparatus of the exposure light source of the projection exposure apparatus.

Returning to FIG. 2A, a helical/spiral groove part 26d is formed around an axis that is parallel to the longitudinal direction L across a portion of an outer surface of the shaft part 26b that extends from the vicinity of the flange part 26a to the chamfer part 26e (recessed part 26f). A gas (cooling medium) for cooling the base part 26 flows into the groove part 26d from a ventilating apparatus 71 (refer to FIG. 9), which is discussed later, and thereby, even if heat generated by the glass tube 25 is conducted to the base part 26, the base part 26 can be efficiently cooled, and the glass tube 25 is also cooled as a result. In addition, the positional relationship between the groove part 26d and the openings 27A, 27B in FIG. 2B is set so that the cooled gas is efficiently supplied from the ventilating apparatus 71 (refer to FIG. 9) to the groove part 26d in a state wherein the corresponding pins of the mounting apparatus 31 in FIG. 1 are inserted in the openings 27A, 27B.

The recessed part 26f is formed in the base part 26 on the cathode EL2 side between the shaft part 26b and the fixed part

26h. Namely, because the small diameter part 26k, which has a cross sectional area in a plane that is orthogonal to the longitudinal direction L that is smaller than that of the shaft part 26b, is provided between the shaft part 26b and the fixed part 26h, part of the urging mechanism of the mounting apparatus 31 in FIG. 1 can be easily inserted therein.

In this case, the shaft part 26b and the small diameter part 26k each have a circular cross section centered on an axis that is parallel to the longitudinal directions L, and the diameter of the circular cross section of the small diameter part 26k is preferably less than half (e.g., approximately ⅓) that of the shaft part 26b. Thereby, part of the urging mechanism can be deeply inserted in the recessed part 26f and the pressed surface 26g can be easily urged to the open end of the base part 26 with a large force.

In addition, because the groove part 26d is in fluid communication with the recessed part 26f through the chamfer part 26e, the cooling gas can flow smoothly in the longitudinal direction L. In this case, the groove part 26d is helically formed in the surface of the shaft part 26b, and consequently that cooling gas can efficiently cool the entire shaft part 26b (base part 26). Furthermore, instead of the helical groove part 26d, a plurality of groove parts may be provided to the surface of the shaft part 26b in a straight line substantially along the longitudinal directions L, and the cooling gas may flow in these groove parts.

In addition, if LT1 is the length of the entire discharge lamp 1 in the longitudinal direction L, including the glass tube 25 and the base parts 26, 28, and LT2 is the length of the base part 26, which is held by the mounting apparatus 31, in the longitudinal direction L, then it is preferable for the length LT2 to be greater than or equal to ⅕ and less than ¼ of the length LT1 (for example, approximately 0.22 times LT1), as shown in the equation below.

$$LT1/5 \leq LT2 \leq LT1/4 \quad (1)$$

Because the length LT2 is greater than or equal to a lower limit in equation (1), the discharge lamp 1 can be stably held by the mounting apparatus 31 in FIG. 1 via the base part 26 with a sufficient force, and the effect of cooling the base part 26 can be increased. Furthermore, because the length LT2 is less than an upper limit in equation (1), the length and the weight of the entire discharge lamp 1 easily falls within a permissible range. Furthermore, a length LT3 of the base part 28 in the longitudinal direction L on another free end side is, for example, greater than or equal to ⅛ and less than ⅕ of the length LT1 (for example, approximately 0.15 times the length LT1).

In addition, the surface area of the portion of the surface of the shaft part 26b of the base part 26 that mates with (contacts) the opening of the corresponding member of the mounting apparatus 31 in FIG. 1 is preferably greater than the surface area of the groove part 26d formed in the shaft part 26b. This means that a width M1 of the surface (protruding part) of the shaft part 26b in the longitudinal direction L in FIG. 2A is greater than a width M2 of the groove part 26d, as described below. Thereby, it is possible to increase the cooling effect as a result of the flow of the cooling gas to the groove part 26d and to enhance the holding force that is applied to the shaft part 26b.

$$M1 > M2 \quad (2)$$

In more practical terms, the surface area of the portion of the surface of the shaft part 26b that mates with the opening of the corresponding member is preferably at least two times (for example, approximately three times) that of the groove part 26d. This means that the equation below holds true.

Thereby, the holding force applied to the shaft part 26b is further increased and a comparatively greater cooling effect is obtained.

$$M1 > 2 \cdot M2 \quad (3)$$

Moreover, the base part 28 connected to the anode EL1 of FIG. 2A has, in sequence from the rod shaped part 25c side to the open end side: a thin annular part 28h, which has an outer diameter that is slightly larger than the maximum outer diameter of the rod shaped part 25c; a columnar shaft part 28c, which has an outer diameter that is substantially the same as that of the annular part 28h or has an outer diameter that is smaller than that of the annular parts 28h; and a cylindrical cover part 28b, which covers the surface of the shaft part 28c on the open end side, spaced apart therefrom by a small space 28d and which and mates with the shaft part 28c. A cylindrical terminal part 28a, which has an outer diameter that is approximately ⅓ that of the shaft part 28c, is provided on the cylindrical cover part 28b. Furthermore, a groove part 28f is formed helically around an axis that is parallel to the longitudinal direction L in the surface of the shaft part 28c, extending from the open end side to the annular parts 28h. A recessed part 28g is provided between the annular part 28h and the shaft part 28c, and the groove part 28f of the shaft part 28c is in fluid communication with the recessed part 28g. In addition, a circulation hole 28e is formed in the terminal part 28a. The circulation hole fluidcally connects the outer part of the terminal part 28a and the inside part of the cover part 28b, which is a space 28d, so that they are in fluid communication with each other. The cylindrical cover part 28b is formed from a metal that has satisfactory electrical and thermal conductivity.

Figure 8:
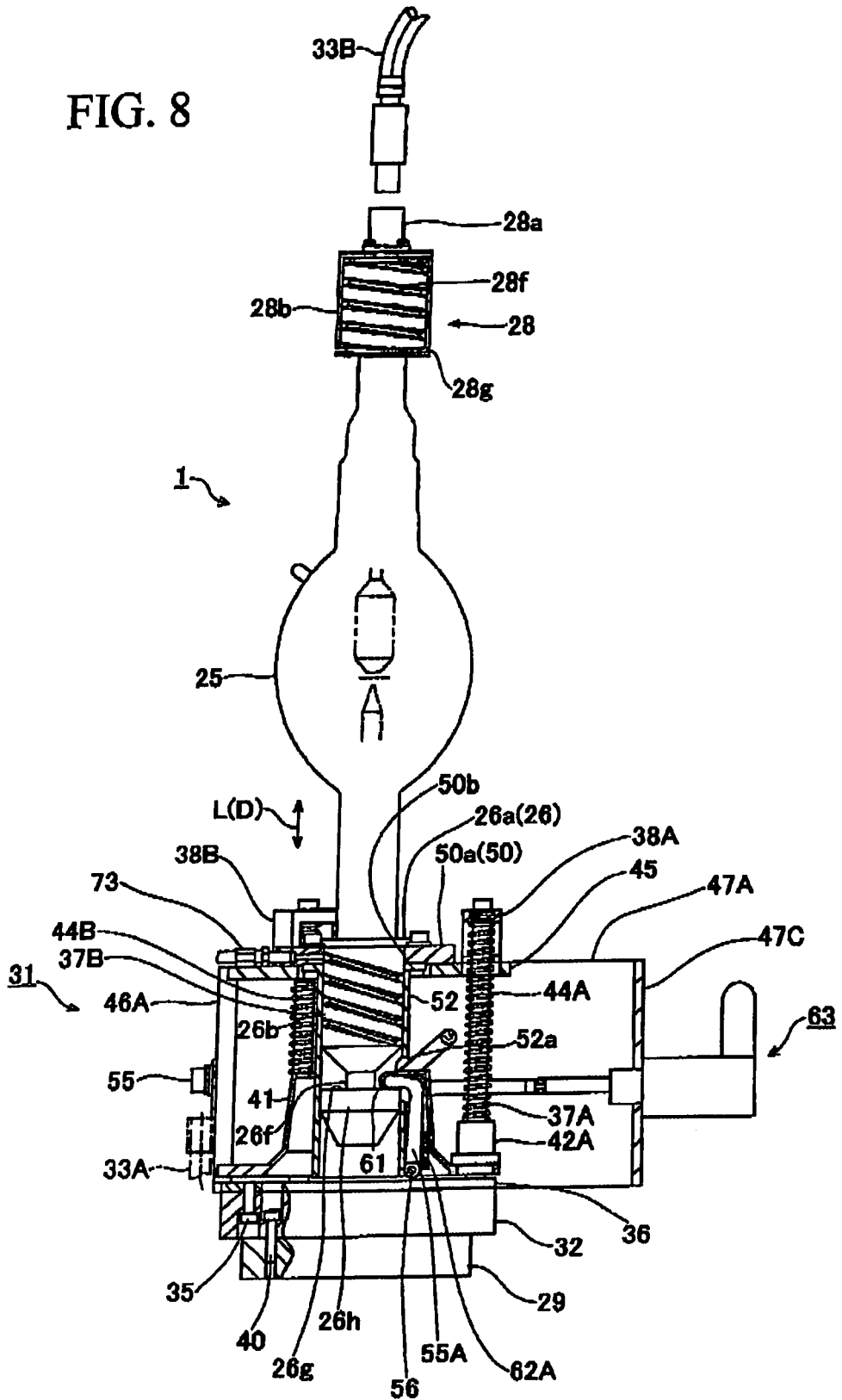
FIG. 8 is a partial cutaway view that shows the discharge lamp 1 in FIG. 2A in a state wherein it is mounted to the mounting apparatus in FIG. 3.

The electric power cable 33B shown in FIG. 8 is connected to the terminal part 28a of the base part 28. In addition to the electric power line that is connected to the anode EL1, piping for supplying cooled gas (cooling medium) through the circulation hole 28e to the groove part 28f are housed in the electric power cable 33B. Thus, the electric power cable 33B is used for supplying cooled gas in addition to electric power, and therefore can also be called a service cable, and the terminal part 28a can also be called a service receiving terminal. Because the electric power cable 33B and the terminal part 28a are used to receive (supply) electric power and cooled gas, respectively, they can be formed compactly.

In FIG. 2A, the cooling gas that is supplied from the electric power cable 33B to the circulation hole 28e inside the terminal part 28a flows inside a conduit that is formed between the cover part 28b and the groove part 28f on the surface of the shaft part 28c of the base part 28, and then is exhausted from the recessed part 28g to the outer side. At that time, the entire base part 28 can be efficiently cooled because the groove part 28f (conduit) is helical. Furthermore, instead of the groove part 28f, multiple groove parts, each of which is provided substantially parallel to the longitudinal direction L, may be formed in the surface of the shaft part 28c in the base part 28, and the cooling gas may be supplied to these groove parts.

Furthermore, if we assume that it is possible to sufficiently cool the base part 26 and the glass tube 25 by just supplying the cooling gas to the groove part 26d of the base part 26 for the cathode EL2, then the conduit through which the cooling gas flows may not necessarily be formed in the base part 28 for the anode EL1. Furthermore, in the discharge lamp 1, it is also possible for the electrode that is connected to the base part 26 held by the mounting apparatus 31 to serve as the anode, and for the electrode that is connected to the base part 28 on the free end side to serve as the cathode.

Figure 3:
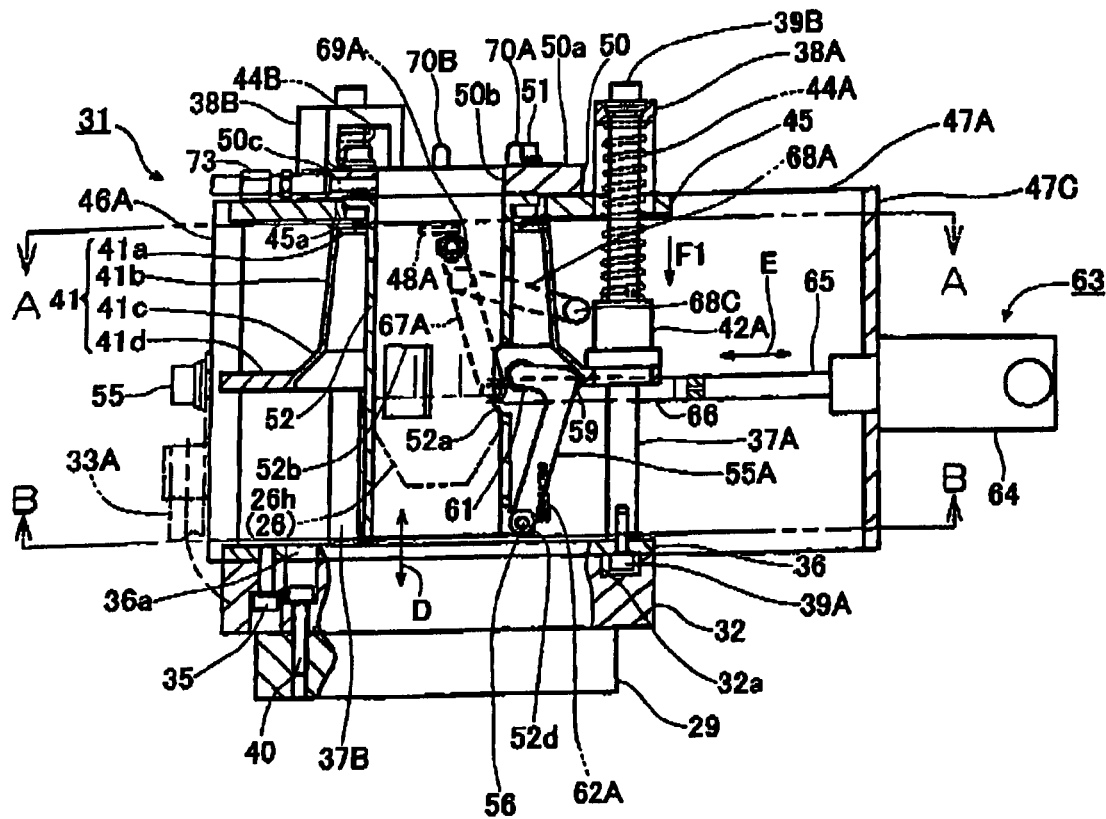
FIG. 3 is a partial cutaway view that shows a mounting apparatus in FIG. 1.
Figure 4:
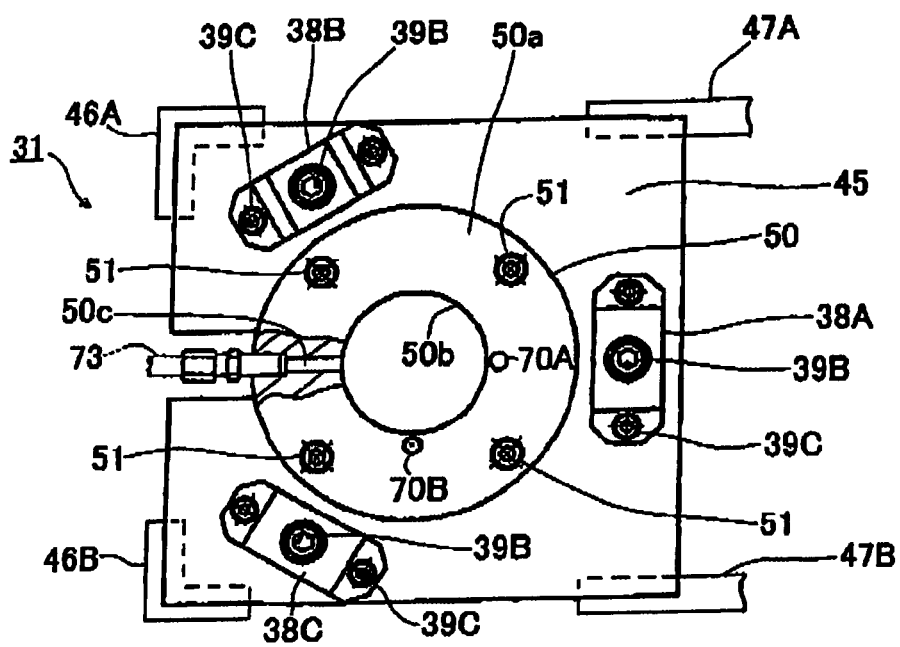
FIG. 4 is a plan view that shows the principal parts of the mounting apparatus in FIG. 3.
Figure 5:
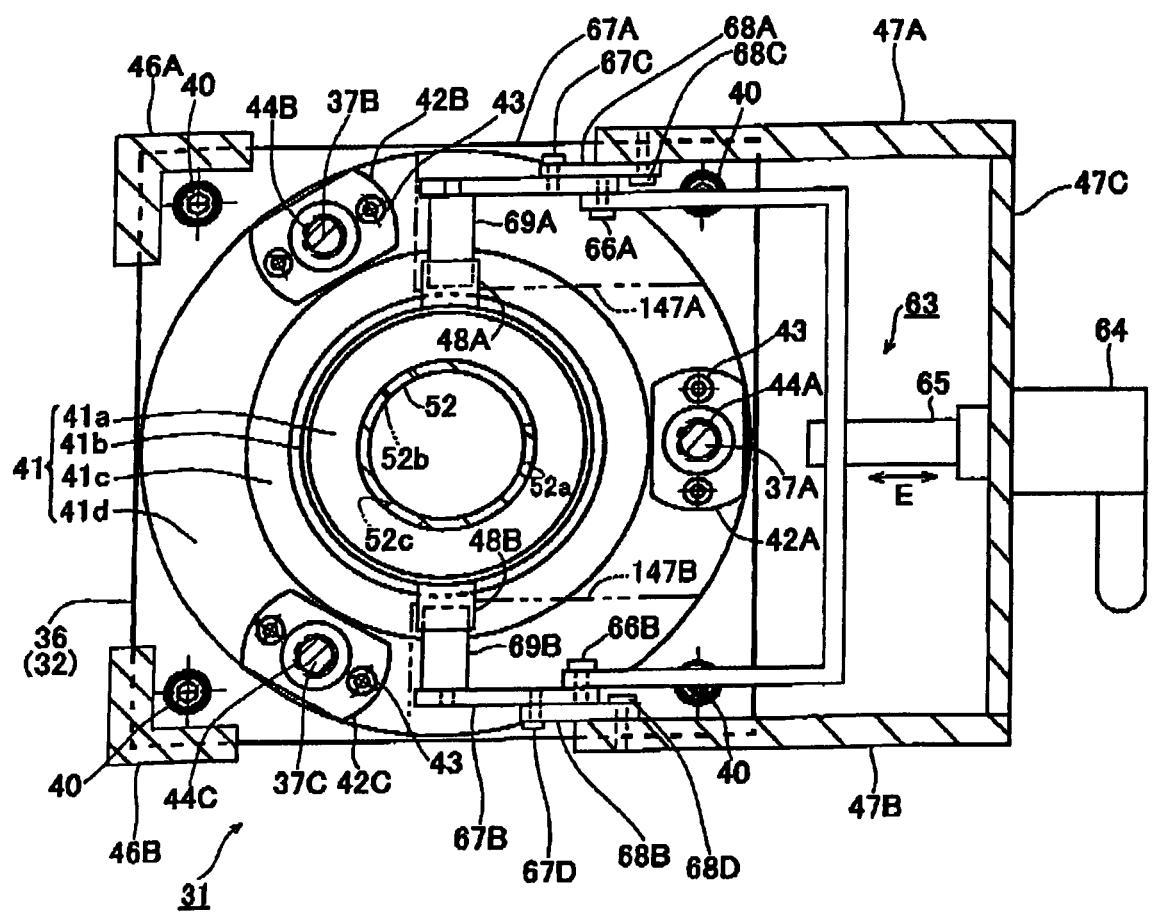
FIG. 5 is a cross sectional view taken along the A-A line in FIG. 3.
Figure 6:
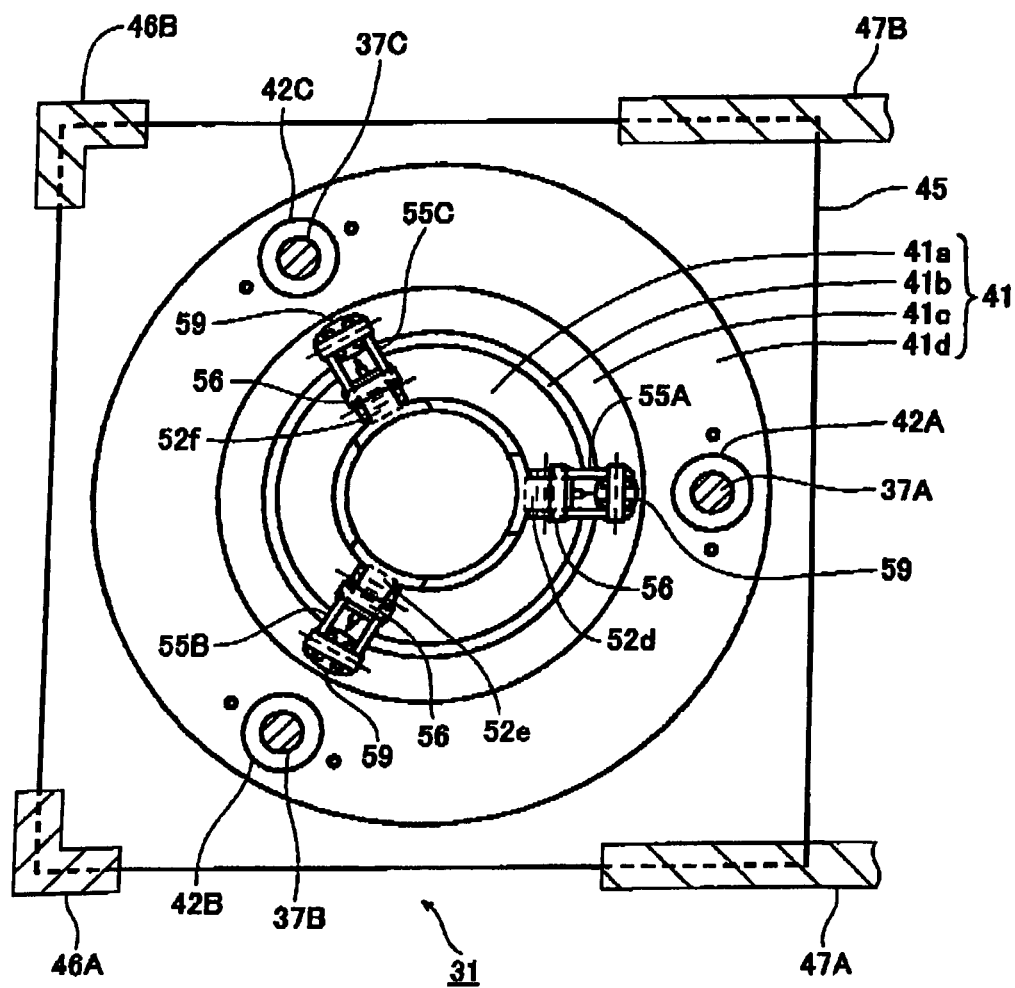
FIG. 6 is a partial cross sectional view taken along the B-B line in FIG. 3.

Next, FIG. 3 shows the configuration of the mounting apparatus 31 of the exposure light source 30 in FIG. 1, FIG. 4 is a plan view of the mounting apparatus 31 in FIG. 3, FIG. 5 is a cross sectional view taken along the A-A line in FIG. 3, and FIG. 6 is a cross sectional view taken along the B-B line in FIG. 3. In FIG. 3, a thin, flat, plate shaped bottom plate 36 is fixed to a surface of a substantially square, flat, plate shaped ceramic insulating plate 32 with bolts 35 at a plurality of locations. In this case, columnar guide members 37A, 37B, 37C (refer to FIG. 5) are fixed in advance to the front surface of the bottom plate 36 using three bolts 39A that are inserted through the bottom plate 36 from its rear surface. Recessed parts 32a, which each house one of the bolts 39A, are formed in the front surface of the insulating plate 32, which makes it possible to fix the bottom plate 36 to the front surface of the insulating plate 32 so that they are in close contact. In each of the four corners of the bottom plate 36, an opening 36a is formed for passing one of the bolts 40 therethrough, and the insulating plate 32 is fixed to the fixed plate 29 by passing the bolts 40 (refer to FIG. 5) through the openings 36a at those four locations. Based on this configuration, the mounting apparatus 31 is fixed to the fixed plate 29 in an insulated state.

In addition, as shown in FIG. 5, frames 46A, 46B, which are L-shaped in a cross sectional view, are fixed to the bottom plate 36 at the two left side corners, flat, plate shaped panel plates 47A, 47B are fixed to the bottom plate 36 at the two right side corners so that they project rightward, and the right end parts of the panel plates 47A, 47B are coupled by a flat, plate shaped panel plate 47C. As shown in FIG. 4, an upper plate 45, which is substantially square, flat plate shaped and has a large circular opening 45a (refer to FIG. 3) formed at its center, is fixed on the frames 46A, 46B and the panel plates 47A, 47B. Three small openings are also formed in the upper plate 45 for passing the tip parts of the three guide members 37A-37C therethrough.

In FIG. 3, an annular positioning plate 50 is fixed to an upper surface of the upper plate 45 by bolts 51 so that it covers the opening 45a, and a flange part of a cylindrical member 52, which is substantially cylindrical, is fixed to a bottom surface of the positioning plate 50 by bolts at, for example, four locations. The flange part 26a of the base part 26 of the discharge lamp 1 in FIG. 2A is mounted to an upper surface 50a of the positioning plate 50, and the shaft part 26b of the base part 26 is mated to a circular opening 50b at the center of the positioning plate 50 and to an inner surface of the cylindrical member 52, which is continuous therewith. Accordingly, the positioning plate 50 and the cylindrical member 52 constitute a member that integrally holds the base part 26 of the discharge lamp 1. The directions along the center axis of the cylindrical member 52 are called movement directions D of the discharge lamp 1.

Figure 9:
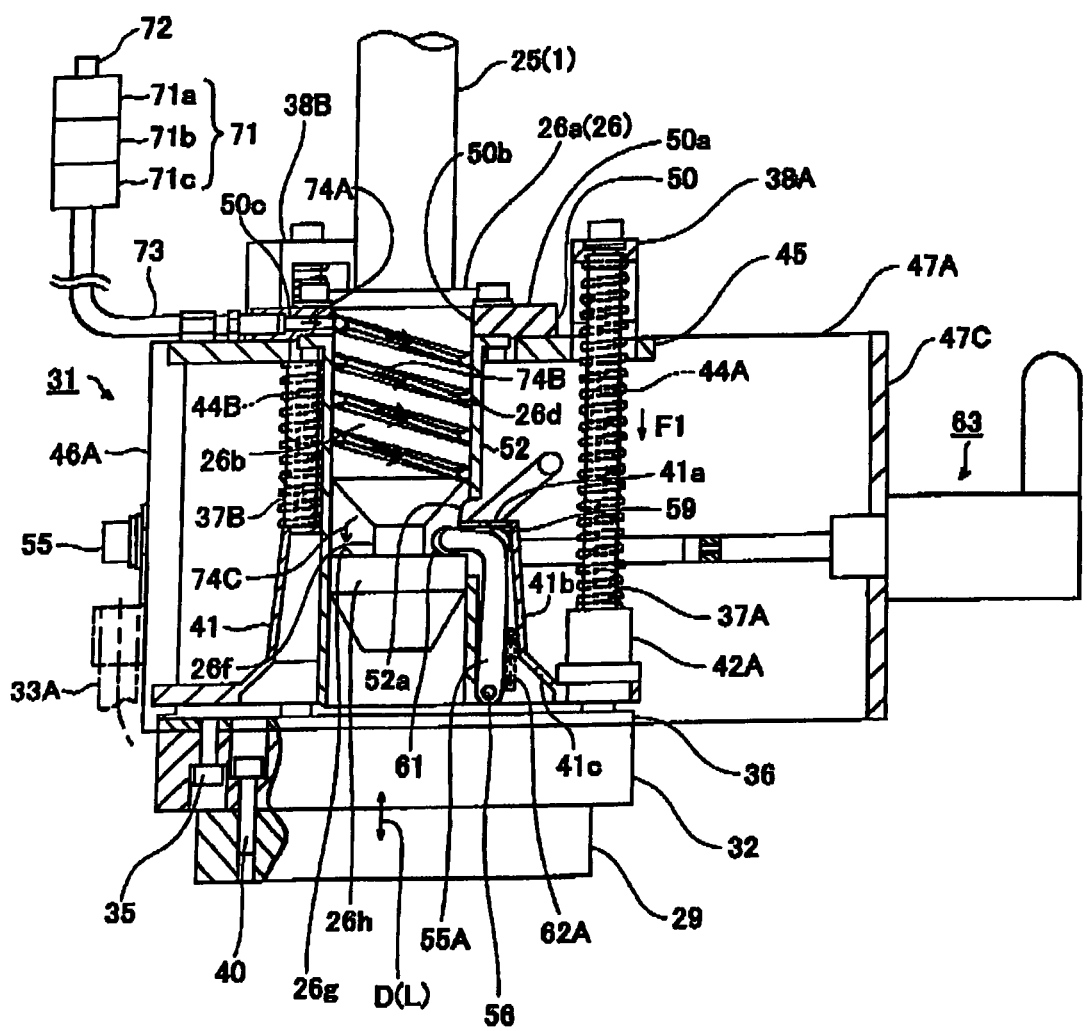
FIG. 9 is a partial enlarged cutaway view of a base part of the discharge lamp in FIG. 8 and a portion of the mounting apparatus.

In addition, a vent 50c is formed so that its side surface and the opening 50b of the positioning plate 50 are in communication, and a terminal of a highly flexible piping 73 is connected to the vent 50c in order to supply the cooled gas from the ventilating apparatus 71 in FIG. 9. Furthermore, as shown in FIG. 4, the pins 70A, 70B are fixed to the upper surface 50a of the positioning plate 50 in an arrangement that corresponds to that of the openings 27A, 27B of the flange part 26a of the discharge lamp 1 in FIG. 2B. Thereby, the flange part 26a of the discharge lamp 1 can always be mounted on the positioning plate 50 at the same angular position.

In FIG. 3, the positioning plate 50, the upper plate 45, and the frames 46A, 46B have electrical continuity and are formed from a metal that has satisfactory electrical and thermal conductivity so as to increase the heat radiating effect, and the electric power cable 33A is fixed to the frame 46A via a bolt 55. By holding the discharge lamp 1 so that the flange part 26a of the base part 26 in FIG. 2A contacts the positioning plate 50, electric power is supplied to the base part 26 via the electric power cable 33A, the frame 46A, the upper plate 45, and the positioning plate 50. Likewise, the cylindrical member 52 is made of a metal that has satisfactory thermal conductivity.

Furthermore, when fixing the positioning plate 50 (coupled with the cylindrical member 52) on the upper plate 45, it is disposed in a state wherein a moving member 41, which is cupped and has an opening at its center so that it can surround the cylindrical member 52, can move in the movement directions D. The moving member 41 is formed, in sequence from the upper plate 45 side to the bottom plate 36 side, by the coupling of: an annular part 41a, which is disposed proximate to the cylindrical member 52; a conical inclined part 41b wherein its inner surface (tapered surface) widens by substantially 5° as one goes toward the bottom plate 36 in the movement directions D; a conical housing part 41c, the inner surface (tapered surface) of which widens more than the inclined part 41b by approximately 40°; and a drive part 41d, which has an annular shape that is larger than the annular part 41a, wherein openings are formed at three locations for passing the guide members 37A-37C (refer to FIG. 5) therethrough. As shown in FIG. 5, small, flat, plate shaped lifting members 48A, 48B are fixed at two locations to an upper end of the annular part 41a so that they sandwich such in a manner wherein they are substantially parallel to the panel plates 47A, 47B.

In addition, in FIG. 5, coupling members 42A, 42B, 42C are fixed to the drive part 41d of the moving member 41 by bolts 43 so that they cover three openings that are provided at equiangular intervals, and the guide members 37A-37C are inserted through the through holes of the coupling members 42A-42C, respectively.

As shown in FIG. 4, substantially inverse U-shaped fasteners 38A, 38B, 38C are fixed to the upper surface of the upper plate 45 using bolts 39C so that they cover the three holes that are disposed so that they surround the positioning plate 50, and the tips of the guide members 37A-37C in FIG. 5 are fixed to the centers of the fasteners 38A-38C, respectively, using bolts 39B. Furthermore, compression coil springs 44A, 44B, 44C (refer to FIG. 5) are mounted between the fasteners 38A-38C and the coupling members 42A-42C so that they cover the guide members 37A-37C, respectively. As a result, the compression coil springs 44A-44C continuously apply a pressing force F1 to the drive part 41d of the moving member 41 in the movement direction D that goes toward the bottom plate 36 side via the three coupling members 42A-42C. Accordingly, the moving member 41 moves along the cylindrical member 52 toward the bottom plate 36 side unless a switching link mechanism 63 (discussed later) applies a driving force to the lifting members 48A, 48B, which are fixed to the annular part 41a of the moving member 41, toward the upper plate 45 side.

In addition, in FIG. 3, three rectangular window parts 52a, 52b, 52c (refer to FIG. 5) are formed (at the same angles as the guide members 37A-37C) at substantially intermediate positions of the side surface of the cylindrical member 52 between the upper plate 45 and the bottom plate 36, three protruding parts 52d, 52e, 52f are formed at the same angles as the window parts 52a-52c on a lower end part of the cylindrical member 52, and substantially L-shaped fixing arms 55A, 55B, 55C (refer to FIG. 6) are fixed to the protruding parts 52d-52f, respectively, so that they are rotatable around corresponding shafts 56. As representatively shown by a coil spring 62A, a small torque is continuously applied to each of the fixing arms 55A-55C so that it rotates toward the outer side with respect to the cylindrical member 52.

Figure 7A:
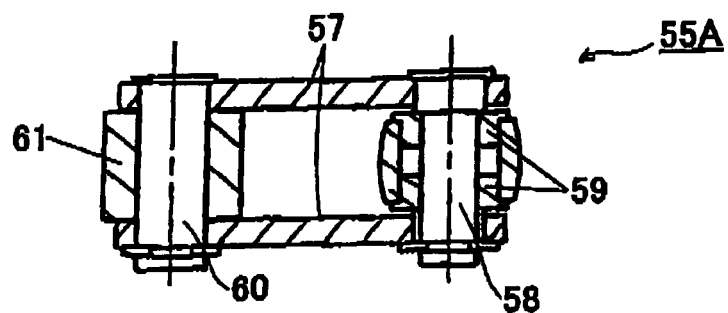
FIG. 7A is an enlarged cross sectional view of a fixing arm in FIG. 3, viewed from above.
Figure 7B:
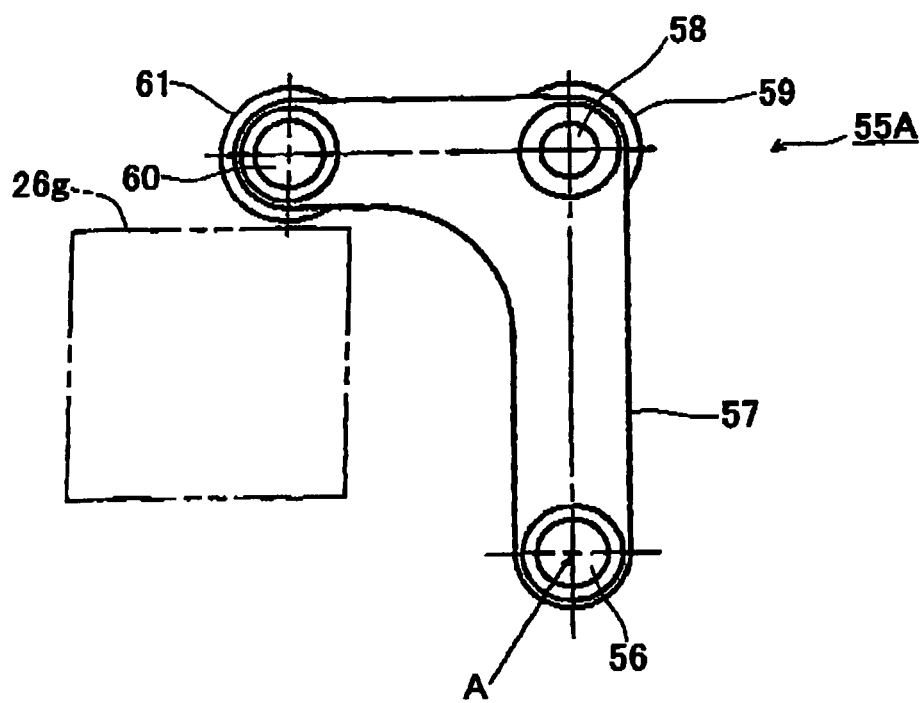
FIG. 7B is an enlarged front view of that fixing arm.

FIG. 7A is a plan cross sectional view of the fixing arm 55A in FIG. 3, and FIG. 7B is a front view of that fixing arm 55A; one end of a frame 57 that constitutes the fixing arm 55A is rotatable around a center of rotation A via the corresponding shaft 56, a roller 61 is fixed to another end of the frame 57 via a rotary shaft 60, and rollers 59 are each fixed to an intermediate bent part of the frame 57 via a small bearing 58. Accordingly, each of the rollers 59, 61 is rotatable, and the counterclockwise rotation of the fixing arm 55A around the shaft 56 urges the roller 61 toward a surface that is to be fixed (in the present embodiment, the pressed surface 26g of the base part 26 of the discharge lamp 1 in FIG. 2A).

In the state shown in FIG. 3, the moving member 41 is at the position along the cylindrical member 52 that is closest to the upper plate 45, the rollers 59 at the bent parts of the fixing arms 55A-55C are urged toward the housing part 41c of the moving member 41, and the rollers 61 emerge from the window parts 52a-52c of the cylindrical member 52. Accordingly, the shaft part 26b and the fixed part 26h of the base part 26 of the discharge lamp 1 in FIG. 2A can move freely in the movement directions D along the opening 50b of the positioning plate 50 and the inner surface of the cylindrical member 52.

FIG. 9 shows one example of a state wherein the moving member 41 has been lowered from the state in FIG. 3 to the position along the cylindrical member 52 that is closest to the bottom plate 36; in FIG. 9, the roller 59 of the fixing arm 55A (and likewise for those of the other fixing arms 55B, 55C) contacts the inclined part 41b of the moving member 41 and is urged toward the inner side of the cylindrical member 52. As a result, torque is applied counterclockwise around the shaft 56 to the fixing arm 55A, and the roller 61 on the other end side of the fixing arm 55A is inserted inwardly through the window part 52a of the cylindrical member 52. In the state in FIG. 9, the shaft part 26b the fixed part 26h of the base part 26 of the discharge lamp 1 mate inside the cylindrical member 52, and consequently the roller 61 of the fixing arm 55A is inserted into the recessed part 26f of the base part 26 and, furthermore, contacts the pressed surface 26g, which is the upper surface of the fixed part 26h. In this state, the pressing force of the compression coil springs 44A, 44B and the like is applied to the pressed surface 26g (base part 26) via the moving member 41 and the fixing arm 55A, and consequently the flange part 26a of the base part 26 is pushed against the upper surface 50a of the positioning plate 50 of the mounting apparatus 31, which stably holds the base part 26 along with the discharge lamp 1. Accordingly, the fixing arms 55A-55C constitute part of the member that applies a pressing force to the base part 26 (fixed part 26h) toward the bottom plate 36 side.

The following explains the configuration of the switching link mechanism 63, which lifts the lifting members 48A, 48B of the moving member 41 to the upper plate 45 side in order to release the pressing force that is applied to the base part 26 (fixed part 26h) by the fixing arm 55A-55C.

In FIG. 3, a rotary lever part 64, which comprises an insulating material, is fixed to substantially the center of the panel plate 47C, a movable rod 65, which is movable in drive directions E that are orthogonal to the movement directions D, is coupled to a tip of the rotary lever part 64 on the inner side of the panel plate 47C, and a branching member 66, which is substantially U-shaped in a plan view, is fixed to a tip of the movable rod 65. In the present embodiment, for example, the operator's manual rotation of the rotary lever part 64 causes the movable rod 65, which is interlocked therewith, to move in the drive directions E. Furthermore, the mechanism that moves the movable rod 65 is arbitrary and, for example, the operator may directly manipulate an extended movable rod 65 without using the rotary lever part 64. In addition, instead of orthogonal, the drive directions E may be, for example, substantially parallel to the movement directions D.

In FIG. 5, the panel plates 47A-47C that hold the rotary lever part 64 are both formed from, for example, an insulating material. Furthermore, one end each of two long, thin link members 67A, 67B, which are rotatable around shafts 66A, 66B, respectively, are coupled to two tip parts of the branching member 66; rollers 69A, 69B are rotatably coupled to the other ends of the link members 67A, 67B; and the rollers 69A, 69B are capable of contacting the lifting members 48A, 48B, which are fixed to the annular part 41a of the upper end of the moving member 41, from the bottom surface. Furthermore, one end each of two long, thin link members 68A, 68B, which are rotatable around shafts 68C, 68D, are fixed to the upper parts of the panel plates 47A, 47B, respectively, and the other ends of the link members 68A, 68B are coupled to the link members 67A, 67B at intermediate positions thereof via shafts 67C, 67D, respectively (refer to FIG. 3). Thus, the switching link mechanism 63 comprises the rotary lever part 64, the movable rod 65, the branching member 66, the link members 67A, 67B, the link members 68A, 68B, and the rollers 69A, 69B. Alternatively, each of the intermediate positions is not limited to the right middle position, and can be any position between one end part of the link member 68A or 68B and another end part. Furthermore, to reliably prevent mechanical interference between the moving member 41 and a link mechanism of the switching link mechanism 63, the two end parts 147A, 147B, which are surrounded by dotted lines, of the housing part 41c and the drive part 41d of the moving member 41 may be eliminated, as shown in FIG. 5.

Figure 10A:
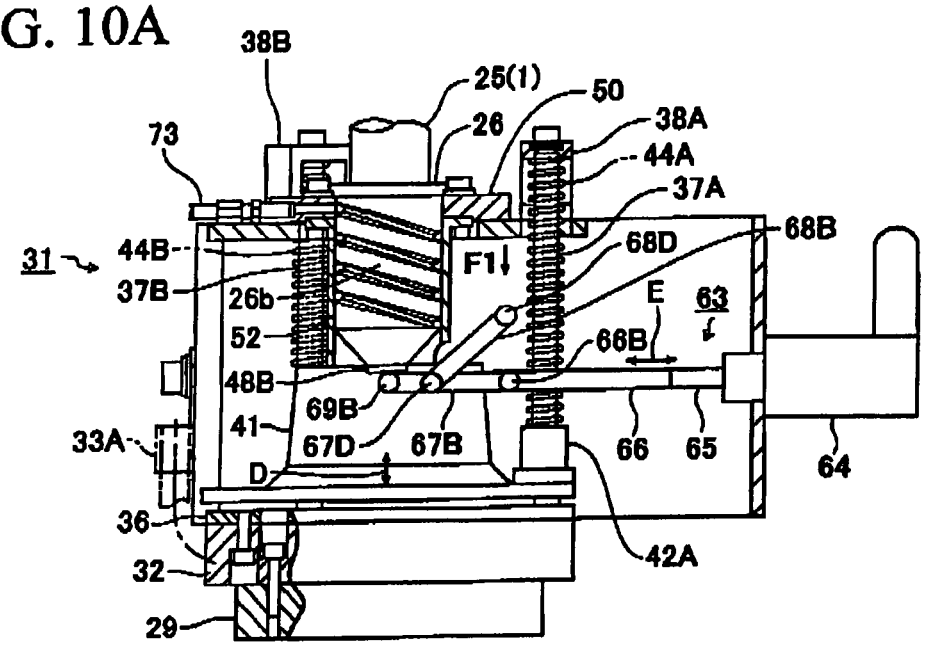
FIG. 10A shows the mounting apparatus in FIG. 3 in a state wherein a switching link mechanism has lowered a moving member.
Figure 10B:
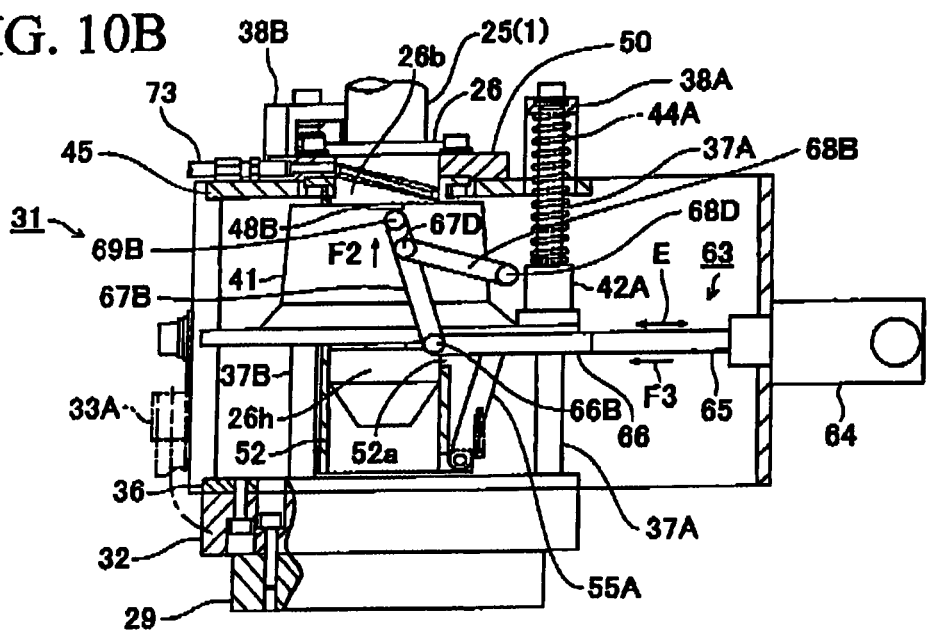
FIG. 10B shows a state wherein the switching link mechanism has raised the moving member.

FIGS. 10A and 10B correspond to views that show the link members 67B, 68B on the near side of the switching link mechanism 63 in FIG. 3 as well as a state wherein the base part 26 of the discharge lamp 1 is held by the mounting apparatus 31; as shown in FIG. 10A, in a state wherein the rotary lever part 64 has been operated and the movable rod 65 has moved to its right end part in the drive direction E thereof, the link member 67B (likewise, the link member 67A in FIG. 5) is substantially parallel to the movable rod 65, and the moving member 41 descends to the lowest end in the movement direction D thereof. As a result, the roller 61 of the fixing arm 55A in FIG. 3 urges the fixed part 26h of the base part 26 downward, and the base part 26 is thereby held stably.

In contrast, as shown in FIG. 10B, in a state wherein the rotary lever part 64 has been operated and an urging force F3 has been applied to the movable rod 65 so that it is moved to its left end part in the drive direction E thereof, the rotation of the link member 68B raises the roller 69B (likewise, the roller 69A in FIG. 5) at the tip part of the link member 67B, and thereby the lifting member 48B and the moving member 41 rise. As a result, as shown in FIG. 3, the fixing arm 55A rotates to the outer side until it contacts the housing part 41c, by the coil spring 62A, the roller 61 emerges from the window part 52a of the cylindrical member 52, and consequently the fixed part 26h of the base part 26 can be pulled out from the cylindrical member 52, and the discharge lamp 1 can be removed from the mounting apparatus 31 thereby.

Thus, using the switching link mechanism 63 in FIG. 5 makes it possible to switch easily between fixing and releasing the base part 26 of the discharge lamp 1 to and from the mounting apparatus 31. Furthermore, in addition to the switching link mechanism 63, it is possible to use an arbitrary mechanism that lifts the moving member 41 in FIG. 3 in one of the movement directions D. For example, it is also possible to use a mechanism wherein the rollers 69A, 69B are directly fixed to the tip parts of the link members 68A, 68B in FIG. 5, and the lifting members 48A, 48B of the moving member 41 are raised by the operator's rotation of the link members 68A, 68B.

As shown in FIG. 3 through FIG. 6, the mounting apparatus 31 according to the present embodiment as discussed above comprises: the frame mechanism, which comprises the insulating plate 32, the bottom plate 36, the upper plate 45, the frames 46A, 46B, and the panel plates 47A-47C; the member that comprises the positioning plate 50 and the cylindrical member 52 and that holds the base part 26 of the discharge lamp 1; the fixing arms 55A-55C, which apply the pressing force to the fixed part 26h of the base part 26; the mechanism that comprises the moving member 41, the guide members 37A-37C, the coupling members 42A-42C, the coil spring 62A, as well as the compression coil springs 44A-44C (elastic members), and that applies the urging force to the fixing arms 55A-55C; the switching link mechanism 63, which releases the urging force applied to the fixing arms 55A-55C by the previously mentioned mechanism; the electric power cable 33B on the base part 28 side in FIG. 8; a gas supply apparatus (not shown) that supplies cooled gas to the electric power cable 33B; the piping 73 in FIG. 3; and the ventilating apparatus 71 in FIG. 9 that supplies the cooled gas to the piping 73.

In FIG. 9, the ventilating apparatus 71 comprises: a filter part 71a, which eliminates dust from the gas (e.g., air) that was taken in from an intake port 72; a cooling part 71b that cools the gas supplied from the filter part 71a; and a ventilating part 71c that supplies a prescribed volume of flow of the gas, which is supplied from the cooling part 71b, to the piping 73 side. Furthermore, for example, a temperature sensor may be provided to the outer surface of the cylindrical member 52, and the set temperature in the cooling part 71b may be controlled based on the measurement result of the temperature sensor.

The following explains one example of the operation of mounting and removing the discharge lamp 1 in FIG. 2A of the present embodiment to and from the mounting apparatus 31 in FIG. 3, referencing FIGS. 8-10.

FIG. 8 shows a state wherein the discharge lamp 1 is mounted to the mounting apparatus 31, FIG. 9 is an enlarged view that shows the base part 26 of the discharge lamp 1 in FIG. 8 and the mounting apparatus 31, and FIGS. 10A and 10B, which correspond to FIG. 3, show the operation of the switching link mechanism 63.

First, when the operator mounts the discharge lamp 1 to the mounting apparatus 31 (at this stage, the base part 26 is not mounted to the mounting apparatus 31), he or she operates the switching link mechanism 63 and, as shown in FIG. 10B, the urging force F3 lifts the roller 69B, the moving member 41 is raised toward the upper plate 45 side via the lifting member 48B, and the tip part (the roller 61 in FIG. 3) of the fixing arm 55A (likewise for the other fixing arms 55B, 55C in FIG. 6) is pulled out from the window part 52a of the cylindrical member 52. In this state, the operator causes the fixed part 26h and the shaft part 26b of the base part 26 of the discharge lamp 1 in FIG. 2A to mate to the opening of the positioning plate 50 and the inner surface of the cylindrical member 52. At this time, because the chamfer parts 26i, 26e are formed in the base part 26 as shown in FIG. 2A, the fixed part 26h and the shaft part 26b can be inserted smoothly along the opening of the positioning plate 50 and the inner surface of the cylindrical member 52.

Next, as shown in FIG. 10A, when the operator operates the switching link mechanism 63 so as to lower the roller 69B, the pressing force F1 of the compression coil spring 44A (and the compression coil springs 44B, 44C in FIG. 5) urges the moving member 41 toward the bottom plate 36 side. At this time, as shown in FIG. 3, the roller 59 of the fixing arm 55A moves from the housing part 41c to the inclined part 41b of the moving member 41, and the pressing force F1 causes torque that is centered on the shaft 56 to act on the fixing arm 55A in a counterclockwise direction. Furthermore, as shown in FIG. 8, the roller 61 of the fixing arm 55A is inserted through the window part 52a of the cylindrical member 52 toward the recessed part 26f side of the base part 26; furthermore, the roller 61 urges the pressed surface 26g of the base part 26 toward the bottom plate 36 side. In this state, the movement directions D of the base part 26 along the inner surface of the cylindrical member 52 coincide with the longitudinal direction of the discharge lamp 1. Furthermore, the discharge lamp 1 is stably held by the mounting apparatus 31 in the state wherein: the flange part 26a of the base part 26 tightly contacts the upper surface 50a of the positioning plate 50; and the shaft part 26b of the base part 26 is mated to the opening 50b of the positioning plate 50 and the inner surface of the cylindrical member 52.

In FIG. 8, the highly flexible electric power cable 33B is coupled to the terminal part 28a of the base part 28. Electric power is supplied from the electric power cable 33B to the terminal part 28a, and cooled gas is supplied via the piping inside the electric power cable 33B to the conduit between the groove part 28f and the cover part 28b of the base part 28. The supplied gas is exhausted from the recessed part 28g to the outer side, and thereby the base part 28 is efficiently cooled.

In addition, electric power is supplied to the base part 26, which is held by the mounting apparatus 31, via the electric power cable 33A, the frame 46A, the upper plate 45, and the positioning plate 50, and thereby light is emitted inside the glass tube 25. Furthermore, as shown in FIG. 9, which is an enlargement of the principal parts in FIG. 8, cooled gas is supplied from the ventilating apparatus 71 to the vent 50c of the positioning plate 50 via the piping 73. As shown by arrows 74A, 74B, 74C, the supplied gas is exhausted out of the window part 52a (and the other two window parts) of the cylindrical member 52 via the vent 50c, the conduit between the cylindrical member 52 and the groove part 26d of the base part 26, and the recessed part 26f. Thereby, the base part 26 and the glass tube 25 are efficiently cooled.

Next, when the operator removes the discharge lamp 1 from the mounting apparatus 31 in FIG. 8 in order to, for example, replace the discharge lamp 1, he or she operates the switching link mechanism 63 and, as shown in FIG. 10B, the moving member 41 is raised to the upper plate 45 side via the roller 69B and the lifting member 48B, and the tip part (the roller 61 in FIG. 3) of the fixing arm 55A emerges from the window part 52a of the cylindrical member 52. Thereafter, the operator pulls the base part 26 out of the positioning plate 50 and the cylindrical member 52, which makes it possible to remove the discharge lamp 1 from the mounting apparatus 31 easily.

Thus, according to the exposure light source 30 of the present embodiment, which comprises the discharge lamp 1 and the mounting apparatus 31, it is possible to easily remove and mount the discharge lamp 1 from and to the mounting apparatus 31 in a short period of time merely by the switching link mechanism 63 releasing the pressing applied by the fixing arms 55A-55C to the fixed part 26h of the base part 26 of the discharge lamp 1. In addition, the discharge lamp 1 is pressed and fixed to the positioning plate 50 with a prescribed and substantially constant pressing force due to the urging force of the compression coil springs 44A-44C merely by the switching link mechanism 63 commencing the pressing by the fixing arms 55A-55C against the fixed part 26h in one of the movement directions D (equal to the longitudinal direction L of the discharge lamp 1) of the base part 26. Accordingly, the pressing force that is applied when fixing the discharge lamp 1 to the mounting apparatus 31 can be set easily within a target range by adjusting, for example, the spring constants of those compression coil springs 44A-44C.

In addition, when cooling gas is supplied from the ventilating apparatus 71 in FIG. 9 to the groove part 26d of the base part 26, that gas flows along the surface of the base part 26 toward the fixed part 26h side, which makes it possible to efficiently cool the discharge lamp 1 with a simple mechanism.

In addition, as shown in FIG. 9, the mounting apparatus 31 of the present embodiment comprises: the moving member 41, which comprises the inclined part 41b that has an inner surface (tapered surface) that is inclined with respect to the movement directions D, that moves in the movement directions D by the action of the elastic force of the compression coil springs 44A-44C; and the fixing arms 55A-55C, which contact the inner surface of the inclined part 41b and convert the movement of the moving member 41 in one of the movement directions D to movement toward the recessed part 26f of the base part 26, wherein the rollers 61 at their tips are inserted into the recessed part 26f, in the insertion direction; thereby, the fixing arm 55A urges the pressed surface 26g, which makes it possible to apply the pressing force to the base part 26 in one of the movement directions D easily.

Furthermore, in addition to the compression coil springs 44A-44C, it is also possible to use tension coil springs, leaf springs, or the like as the members that apply the pressing force F1 to the moving member 41. In addition, because a plurality (three herein) of the fixing arms 55A-55C is disposed at the circumference of the base part 26 at equiangular intervals, the base part 26 is held by the mounting apparatus 31 with a uniform force. Furthermore, it is also possible to fix the base part 26 with, for example, just one fixing arm 55A.

In addition, in FIG. 8, the cable for supplying electric power and the piping through which the cooled gas is supplied are housed in parallel in the electric power cable 33B on the base part 28 side in the present embodiment. Nonetheless, a flexible tubular cable that is formed from a conductive body that conducts the electric power and guides the cooling gas may be used as the electric power cable 33B. Thereby, it is possible to simplify the configuration of the electric power cable 33B.

The following explains one example of the manufacturing method and the method of use (operating method) for a case wherein an exposure light source that comprises the discharge lamp 1 and the mounting apparatus 31 shown in the above-mentioned FIG. 8 and FIG. 9, respectively, is used as the exposure light source 30 of the projection exposure apparatus in FIG. 1.

One example of the manufacturing method is a method of manufacturing a projection exposure apparatus wherein light generated by a discharge between two electrodes of the discharge lamp 1 in FIG. 1 is used to expose the wafer W with the image of the pattern of the reticle R, and comprises the steps of: a step S1 (not shown) that mounts the discharge lamp 1 to the mounting apparatus 31 shown in FIG. 8, which is for holding the discharge lamp 1, via the base part 26 of the discharge lamp 1; a step S2 (not shown) that connects the electric power cable 33B (service cable) to the terminal part 28a of the base part 28 of the discharge lamp 1; and a step S3 (not shown) that cools the base part 26 of the discharge lamp 1 in a state wherein the discharge lamp 1 is thus mounted to the mounting apparatus 31. Thereby, the discharge lamp 1 can be efficiently cooled.

In this case, step S1 can further include: a step S11 (not shown) that inserts part (the shaft part 26b and the fixed part 26h) of the base part 26 in the opening 50b of the positioning plate 50 and along the inner surface of the cylindrical member 52 of the mounting apparatus 31; a step S12 (not shown) wherein the base part 26, which is inserted in the mounting apparatus 31, is urged with a pressing force (holding force) so that the discharge lamp 1 can be held; and a step S13 (not shown) that forms a cooling gas conduit between the cylindrical member 52 of the mounting apparatus 31 and the groove part 26d of the base part 26.

Furthermore, step S3 can include a step 31 (not shown) that supplies cooling gas from the ventilating apparatus 71 in FIG. 9 to the conduit formed by step S13. Thus, the flow of cooling gas to the conduit, which is substantially sealed, makes it possible to cool the base part 26 more efficiently.

In addition, it is possible to include further a step S4 (not shown) that cools the base part 28, to which the electric power cable 33B is connected, with the cooling liquid supplied via the electric power cable 33B. Thereby, the base part 28 is cooled and, in turn, it is also possible to cool the glass tube 25 of the discharge lamp 1 efficiently.

The following explains various other embodiments of the discharge lamp of the present invention, referencing FIG. 11A through FIG. 18B. The various discharge lamps explained below can be attached and detached easily to and from the mounting apparatus 31 in FIG. 3 and FIG. 4, and the fixing force can be set easily as needed so that it falls within a target range. Furthermore, a light source that is constituted by mounting any of these discharge lamps to the mounting apparatus 31 can be used as the exposure light source 30 of the exposure apparatus in FIG. 1. In addition, for each discharge lamp of discharge lamps 1A-1O shown in FIGS. 11A-11D, FIGS. 12A-12D, FIGS. 13A-13C, FIGS. 14A, 14B, and FIGS. 15A, 15B, the cooling medium (gas or liquid) flows to the conduit that is formed between the groove part of the surface (or the surface itself) of a shaft part of the one base part and the cylindrical member 52 of the mounting apparatus 31 in FIG. 3; for each discharge lamp of discharge lamps 1P, 1Q shown in FIGS. 15C, 15D, the cooling medium flows to a fluid path, which is provided between a fixed part (urged part) and the vicinity of the flange part so that it passes through the interior of the shaft part of the one base part; and for each discharge lamp of discharge lamps 1AA, 1AB shown in FIGS. 18A, 18B, the portion that functions as the mating part and the portion that is contacted by the cooling medium are separate in the one base part. Below, parts in FIG. 11A through FIG. 18B that correspond to those in FIG. 2A and FIG. 2B are assigned identical or similar symbols, and detailed explanations thereof are omitted or simplified.

First, the discharge lamp 1A in FIG. 11A is configured by fixing base parts 26A, 28, whereto a cathode and an anode (not shown) for forming the light emitting part are respectively connected, so that a glass tube 25A, which includes the bulb part 25a wherein the light emitting part is formed, is interposed thereby in the longitudinal direction, and the base part 26A is fixed by the mounting apparatus 31 in FIG. 3A. Furthermore, although the stepped shapes of rod shaped parts 25Ab, 25Ac of that glass tube 25A are slightly different from those of the rod shaped parts 25b, 25c of the glass tube 25 of the discharge lamp 1 in FIG. 2A, the wavelength and the output of emitted illumination light are substantially the same.

In addition, the base part 26A of the discharge lamp 1A in FIG. 11A differs from the base part 26 in FIG. 2A in that: a groove part 26Ad, which is formed in the shaft part 26b (mating part) thereof is formed helically (e.g., in the shape of a groove for a screw) in a circumferential direction that is the reverse of that of the groove part 26d of the base part 26 in FIG. 2A; and a tip part 26j that is columnar in a cross sectional view and that is substantially the same as the recessed part 26f is formed at the tip of that shaft part 26b. The positional relationship between the opening 27B and a starting point of the groove part 26Ad on the flange part 26a (contact part) side is set so that, when the base part 26A is mounted to the mounting apparatus 31 in FIG. 3, cooled gas (cooling medium), which is supplied from the ventilating apparatus 71 in FIG. 9 to the vent 50c of the positioning plate 50 in FIG. 3, flows into the groove part 26Ad at the starting point. Thereby, the base part 26A and, in turn, the discharge lamp 1A are efficiently cooled.

Next, the discharge lamp 1B in FIG. 11B differs from the discharge lamp 1A in FIG. 11A in that: it is configured so that the glass tube 25A is interposed by base parts 26B, 28; a ring shaped cutaway part 26c (groove part) is formed in the vicinity of the flange part 26a of the shaft part 26b of the base part 26B; and the groove part 26Ad communicates with this cutaway part 26c. As a result, when the base part 26B of the discharge lamp 1B is mounted to the mounting apparatus 31 in FIG. 3, regardless of the positional relationship between the opening 27B and the starting point of the groove part 26Ad, cooled gas, which is supplied from the ventilating apparatus 71 in FIG. 9 to the vent 50c of the positioning plate 50 in FIG. 3, flows into the groove part 26Ad via the cutaway part 26c. This makes it easier to fabricate the groove part 26Ad.

Next, the discharge lamp 1C in FIG. 11C differs from the discharge lamp 1A in FIG. 11A in that: a ring shaped cutaway part 26Cc is formed in the vicinity of the flange part 26a of the shaft part 26b of a base part 26C thereof; and multiple groove parts 26Cd, which are parallel to the longitudinal direction L of the glass tube 25A, are formed in the surface of the shaft part 26b so that the cutaway part 26Cc and the recessed part 26f (stepped part) are in fluid communication. As a result, when the base part 26C of the discharge lamp IC is mounted to the mounting apparatus 31 in FIG. 3, cooled gas (cooling medium), which is supplied from the ventilating apparatus 71 in FIG. 9 to the vent 50c of the positioning plate 50 in FIG. 3, flows to the recessed part 26f side via the cutaway part 26Cc and the groove parts 26Cd. Thereby, the discharge lamp 1C is efficiently cooled.

Next, the discharge lamp 1D in FIG. 11D differs from the discharge lamp 1A in FIG. 11A in that: a groove part D1 is provided to a flange part 26Da of the base part 26D thereof; multiple ring shaped cutaway parts 26Dk, which are centered on an axis that is parallel to the longitudinal direction L, are formed in the longitudinal direction L in the surface of the shaft part 26b; and multiple groove parts D2 are formed in the shaft part 26b between these cutaway parts 26Dk at intervals of, for example, 180°. As a result, when the base part 26D of the discharge lamp 1D is mounted to the mounting apparatus 31 in FIG. 3, the cooled gas supplied from the ventilating apparatus 71 in FIG. 9 to the vent 50c of the positioning plate 50 in FIG. 3 flows over the surface of the shaft part 26b via the groove parts D2, the cutaway parts 26Dk, and the groove part D1, and is then exhausted from the groove part D1 to the glass tube 25A side. Thereby, the base part 26D, the glass tube 25A, and, in turn, the discharge lamp 1D are efficiently cooled.

Next, the discharge lamp 1E in FIG. 12A differs from the discharge lamp 1A in FIG. 11A in that: multiple ring shaped cutaway parts 26Ek (lateral grooves), which are centered on an axis that is parallel to the longitudinal direction L, are formed in the longitudinal direction L in the surface of the shaft part 26b of a base part 26E; and the portions of the shaft part 26b that are between these cutaway parts 26Ek act as a plurality of heat radiating fins. As a result, when the base part 26E of the discharge lamp 1E is mounted to the mounting apparatus 31 in FIG. 3, the cooled gas, which is supplied from the ventilating apparatus 71 in FIG. 9 to the vent 50c of the positioning plate 50 in FIG. 3, flows over the surface of the shaft part 26b via the cutaway parts 26Ek, and thereby the discharge lamp 1E is efficiently cooled.

Next, the discharge lamp 1F in FIG. 12B differs from the discharge lamp 1A in FIG. 1A in that: multiple ring shaped cutaway parts 26Fk, which are centered on an axis that is parallel to the longitudinal direction L, are formed in the longitudinal direction L in the surface of the shaft part 26b of a base part 26F; and four groove parts F11, F12, F13 (the fourth groove part is not shown) are formed in the shaft part 26b between the cutaway parts 26Fk at 90° intervals. As a result, when the base part 26F of the discharge lamp 1F is mounted to the mounting apparatus 31 in FIG. 3, the cooled gas, which is supplied from the ventilating apparatus 71 in FIG. 9 to the vent 50c of the positioning plate 50 in FIG. 3, flows over the surface of the shaft part 26b via the cutaway parts 26Fk and the groove part F11 to the recessed part 26f side, and thereby the discharge lamp 1F is efficiently cooled.

Next, the discharge lamp 1G in FIG. 12C differs from the discharge lamp 1B in FIG. 11B in that the cutaway part 26c is formed in the vicinity of the flange part 26a of the shaft part 26b of a base part 26G thereof, and two helical groove parts 26d, 26Gd, which differ from one another in their rotational directions, are formed in the surface of the shaft part 26b so that they intersect and communicate with the cutaway part 26c.

Moreover, the discharge lamp 1H in FIG. 12D differs from the discharge lamp 1B in FIG. 11B in that the cutaway part 26c is formed in the vicinity of the flange part 26a of the shaft part 26b of a base part 26H thereof, and multiple helical, parallel groove parts 26Hd are formed as a multi-threaded screw (a double-threaded screw in the present embodiment) in the surface of the shaft part 26b so that they communicate with the cutaway part 26c. This discharge lamp 1G (or 1H) exhibits particularly excellent cooling effects because the cooled gas flows along the two groove parts 26d, 26Gd (or the groove parts 26Hd).

Figure 13A:
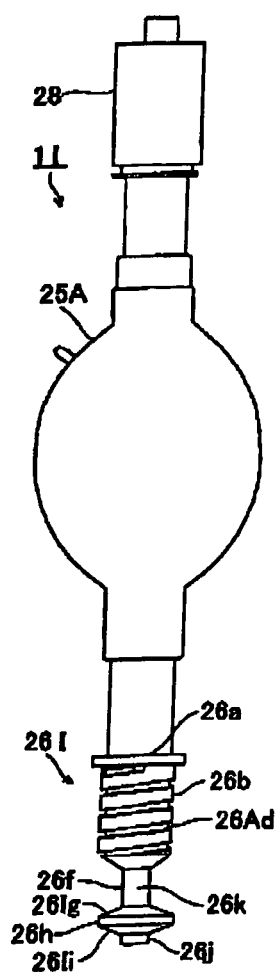
FIG. 13A shows other embodiment of the discharge lamp according to the present invention.

Next, the discharge lamp 1I in FIG. 13A differs from the discharge lamp 1A in FIG. 11A in that: a pressed surface 26Ig of the portions at the tip part of the shaft part 26b of a base part 26I thereof that are urged by, for example, the fixing arm 55A in FIG. 3 is gradually inclined with respect to a plane that is perpendicular to the longitudinal direction of the glass tube 25A; and a chamfer part 26E that, along with the pressed surface 26Ig, sandwiches the fixed part 26h is gradually inclined substantially symmetric to the pressed surface 26Ig. There is a case wherein, when the base part 26I of the discharge lamp 1I is mounted to the mounting apparatus 31 in FIG. 3, it is possible to increase the urging force that is applied to the pressed surface 26Ig by, for example, the fixing arm 55A. In this case, the discharge lamp 1I can be held more stably.

Figure 13B:
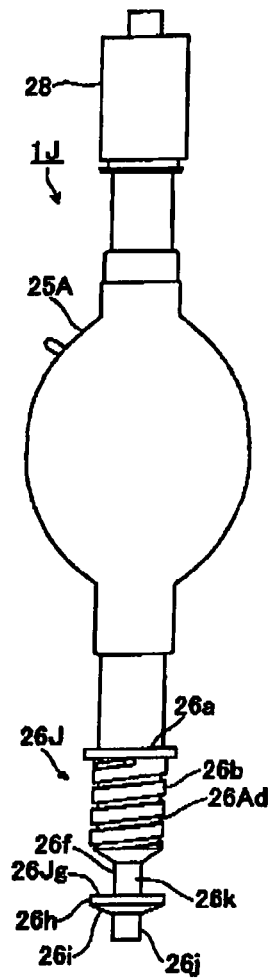
FIG. 13B shows other embodiment of the discharge lamp according to the present invention.

Moreover, the discharge lamp 1J in FIG. 13B differs from the discharge lamp 1A in FIG. 1A in that: a pressed surface 26Jg of a base part 26J thereof is inclined in a direction that is the reverse of that of the pressed surface 26Ig in FIG. 13A; and the fixed part 26h is bowl shaped. Depending on, for example, the supporting method of the fixing arm 55A and the like in FIG. 3, there are cases wherein, when the base part 26J of the discharge lamp 1J is mounted to the mounting apparatus 31 in FIG. 3, it is possible to increase the urging force that is applied to the pressed surface 26Jg by, for example, the fixing arm 55A. In this case as well, the discharge lamp 1J can be held more stably.

Figure 13C:
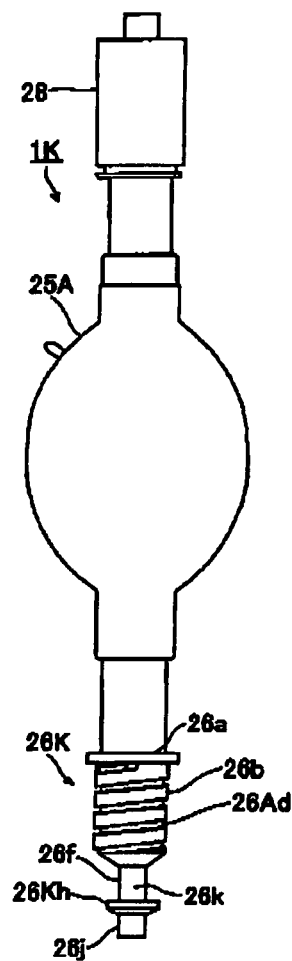
FIG. 13C shows other embodiment of the discharge lamp according to the present invention.

In addition, the discharge lamp 1K in FIG. 13C differs from the discharge lamp 1A in FIG. 11A in that a fixed part 26Kh of a base part 26K thereof is small. Thereby, there are cases wherein the configuration of the mounting apparatus 31 in FIG. 3 can be reduced in size.

Next, the discharge lamp 1L in FIG. 14A differs from the discharge lamp 1B in FIG. 11B in that the cutaway part 26c is formed in the vicinity of the flange part 26a of the shaft part 26b of a base part 26L thereof, and multiple helical groove parts 26Ld, 26Hd, which have different rotational directions, are formed as two multi-threaded screws (e.g., double-threaded screw) in the surface of the shaft part 26b so that they intersect and communicate with the cutaway part 26c.

Moreover, the discharge lamp 1M in FIG. 14B differs from the discharge lamp 1B in FIG. 11B in that a cutaway part 26c is formed in the vicinity of the flange part 26a of the shaft part 26b of a base part 26M thereof; in addition, multiple helical, parallel groove parts 26Ld and multiple long pitched, helical, parallel groove parts 26Md are formed as multi-threaded screws (e.g., a double-threaded screw and a triple-threaded screw, respectively) in the surface of the shaft part 26b so that they intersect and communicate with the cutaway part 26c. These discharge lamps 1L, 1M exhibit particularly excellent cooling effects because they include the groove parts through which the cooling medium flows.

Next, the discharge lamp 1N in FIG. 15A differs from the discharge lamp 1B in FIG. 11B in that three fixed parts 26h1, 26h2, 26h3 are provided in the portion at the tip part of the shaft part 26b of a base part 26N thereof that is urged by the fixing arm 55A and the like in FIG. 3. Because the three fixing arms 55A-55C in FIG. 6 urge the fixed parts 26h1-26h3, respectively, in the longitudinal direction when the base part 26N of the discharge lamp 1N is mounted to the mounting apparatus 31 in FIG. 3, the discharge lamp 1N can be held more stably by the mounting apparatus 31. In this case, the base part 26N can be made lighter than, for example, the discharge lamp 1B in FIG. 11B.

Moreover, the discharge lamp 1O in FIG. 15B differs from the discharge lamp 1A in FIG. 1A in that, with the exception of numerous rectangular shaped protruding parts 26n, the surface of the shaft part 26b of a base part 26O thereof is a recessed part 26m. As shown in FIG. 16A, which is a cross sectional view taken along the A-A line in FIG. 16B, groove parts are formed between the protruding parts 26n of the shaft part 26b of the base part 26O. As a result, when the base part 26O of the discharge lamp 1O is mounted to the mounting apparatus 31 in FIG. 3, cooled gas, which is supplied from the ventilating apparatus 71 in FIG. 9 to the vent 50c of the positioning plate 50 in FIG. 3, flows through the groove parts that are between the protruding parts 26n of the shaft part 26b, and thereby the discharge lamp 1O is efficiently cooled. In this case, the circulation resistance can be reduced by reducing the number of protruding parts 26n, which is more suited to a situation in which it is desired to increase the flow volume of the gas to be supplied.

Next, the discharge lamp 1P in FIG. 15C differs from the discharge lamp 1B in FIG. 11B in that a ring shaped cutaway part 26Pc (groove part) is formed in the vicinity of the flange part 26a (in the present embodiment, at the position at which it contacts the flange part 26a) of the shaft part 26b of a base part 26P thereof, and multiple fluid paths 26Pd, each of which comprises a through hole that is parallel to the longitudinal direction L, are provided (in the present embodiment, is formed) so that each one: communicates with the cutaway part 26Pc; passes through the interior of the shaft part 26b; and extends from the flange part 26a (cutaway part 26Pc) to the recessed part 26f. Each of the fluid paths 26Pd comprises: an opening P1 that communicates with the cutaway part 26Pc; and an opening P2 that communicates with the recessed part 26f (chamfer part 26e). As shown in FIG. 16B, which is a cross sectional view taken along the B-B line in FIG. 15C, the multiple fluid paths 26Pd are disposed along the substantially identical circumference of the shaft part 26b of the base part 26P. As a result, when the base part 26P of the discharge lamp 1P is mounted to the mounting apparatus 31 in FIG. 3, cooled gas, which is supplied from the ventilating apparatus 71 in FIG. 9 to the vent 50c of the positioning plate 50 in FIG. 3, flows inside the shaft part 26b to the recessed part 26f side via the cutaway part 26Pc and the multiple fluid paths 26Pd, and thereby the discharge lamp 1P is efficiently cooled.

Moreover, the discharge lamp 1Q in FIG. 15D differs from the discharge lamp 1B in FIG. 11B in that a ring shaped cutaway part 26Rc (refer to FIG. 17) is formed inside the shaft part 26b of a base part 26Q thereof in the vicinity of the flange part 26a, and a helical fluid path 26Qd is provided (in the present embodiment, is formed) so that it: communicates with the cutaway part 26Rc; passes through the interior of the shaft part 26b; and extends from the vicinity of the flange part 26a to the recessed part 26f. One end of the fluid path 26Qd communicates with an opening Q1, which is provided in the surface of the shaft part 26b in the vicinity of the flange part 26a (via the cutaway part 26Rc), and the other end of the fluid path 26Qd communicates with an opening Q2 that is provided to the recessed part 26f (chamfer part 26e). As shown in FIG. 16C, which is a cross sectional view taken along the C-C line in FIG. 15D, the fluid path 26Qd goes around the interior of the shaft part 26b of the base part 26Q. As a result, when the base part 26Q of the discharge lamp 1Q is mounted to the mounting apparatus 31 in FIG. 3, cooled gas, which is supplied from the ventilating apparatus 71 in FIG. 9 to the vent 50c of the positioning plate 50 in FIG. 3, flows to the recessed part 26f side via the opening Q1, the fluid path 26Qd inside the shaft part 26b, and the opening Q2, and thereby the discharge lamp 1Q is cooled efficiently.

Furthermore, when manufacturing the base part 26Q of the discharge lamp 1Q in FIG. 15D, for example, as shown in FIG. 17, a cylindrical auxiliary base part 26S, wherein the opening Q1 is formed in the vicinity of its upper end, is mated to the outer surface of a rod shaped main base part 26R that is provided with a shaft part 26Rb, wherein the cutaway part 26Rc and the helical fluid path 26Qd are formed in its outer side surface, and a fixed part 26Rh, which has a cross sectional shape that is slightly smaller than that of the shaft part 26Rb, after which, for example, the base parts 26R, 26S may be welded together. Furthermore, the fixing methods therefor may include screwing and bonding.

Furthermore, the fluid path 26Qd may be formed on an inner side surface of the auxiliary base part 26S instead of on the outer side surface of the base part 26Q.

Next, the discharge lamp 1AA, which has a base part 26AA, in FIG. 18A differs from the shaft part 26b of the discharge lamp 1A in FIG. 11A in that it is provided with two portions that have different cross sectional shapes in the directions that are orthogonal to the longitudinal direction. Namely, as shown in FIG. 18A, a shaft portion 26b1, which serves as the mating part and is shorter in the longitudinal direction than the shaft part 26b in FIG. 11A, and a columnar rod part 26b2, which extends from the lower part of the shaft portion 26*b*1 to the small diameter part 26*k* and has a diameter (external shape in the directions that are orthogonal to the longitudinal direction) that is smaller than that of the shaft part 26*b*1, are formed in the base part 26AA of the discharge lamp 1AA.

The rod part 26*b*2 is longer in the longitudinal direction L than the shaft portion 26*b*1 and, furthermore, its surface area is greater than that of the shaft portion 26*b*.

Consequently, when the base part 26AA is mounted to the mounting apparatus 31 in FIG. 3, the vent 50*c* is disposed so that it opposes the rod part 26*b*1 in the vicinity of the shaft portion 26*b*2 so that the cooled gas (cooling medium), which is supplied from the ventilating apparatus 71 in FIG. 9 to the vent 50*c* of the positioning plate 50 in FIG. 3, flows to the surface of the rod part 26*b*2, which functions as a cooling part. Furthermore, the gas that is supplied from the vent 50*c* flows from the shaft portion 26*b*1 side of the rod part 26*b*2 to the small diameter part 26*k*. When the discharge lamp 1AA in the present embodiment is mounted to the mounting apparatus 31, the position of the vent 50*c* should be adjusted in advance so that it opposes the rod part 26*b*2. Furthermore, in the present embodiment, the gas that is supplied from the vent 50*c* can cool the shaft portion 26*b*1 via the rod part 26*b*2 even though it does not directly contact the shaft portion 26*b*1. The remainder of the configuration is the same as that of the discharge lamp 1A in FIG. 11A.

As a result, when the base part 26AA of the discharge lamp 1AA is mounted to the mounting apparatus 31 in FIG. 3, the short shaft portion 26*b*1 positions the discharge lamp 1AA and the cooled gas (cooling medium), which is supplied from the ventilating apparatus 71 in FIG. 9 to the vent 50*c* of the positioning plate 50 in FIG. 3, is blown to the surface of the rod part 26*b*2 of the base part 26AA. Thereby, the base part 26AA and, in turn, the discharge lamp 1AA are efficiently cooled.

Furthermore, as shown by a base part 26AB of the discharge lamp 1AB in FIG. 18B, the helical groove part 26Ad may be formed in the surface of the rod part 26*b*2 below the shaft part 26*b*. Thereby, the surface area of the rod part 26*b*2 that contacts the gas increases, which increases the effect of cooling the base part 26AB.

In the base part 26AA of FIG. 18A, the rod part 26*b*2 and the small diameter part 26*f* may be formed with the same diameter.

In addition, it is obvious that a solid body structure can be adapted wherein the shaft part 26*b*, as shown in FIGS. 11A-11D, FIGS. 12A-12D, FIGS. 14A, 14B, and FIGS. 15A, 15B, is formed in the surface of the rod part 26*b*2.

The discharge lamps 1AA, 1AB in FIGS. 18A, 18B can be efficiently cooled by the gas that is blown to the surface of the rod part 26*b*2, even if the grooves are not formed in the portion (shaft portion 26*b*1) that mates with the cylindrical member 52 of the mounting apparatus 31.

Next, the discharge lamp 1 and the discharge lamps 1A-1Q shown in FIGS. 2A-2C, FIGS. 11A-16C, and FIG. 18A-18B are each a discharge lamp that can be said to comprise: the glass tube 25 (or 25A) that forms the light emitting part; and the base member 26 (or 26A-26Q) that couples with the glass tube; wherein, in sequence in the direction away from the glass tube along a first axis that is parallel to one of the longitudinal direction L (first direction), the base member comprises: a flange part 26*a* (or 26Da) that has a shape that includes a discoidal shape, which is centered on the first axis and has a radius that is greater than or equal to a first radius (R1); and a shaft part 26*b* that has a shape such that it is circumscribed by a columnar shape, which is centered on the first axis and has a second radius (R2) that is smaller than the first radius R1. Furthermore, the discharge lamp can be said to comprise: a small diameter part 26*k* that has a shape that includes a columnar shape, which is centered on the first axis and has a third radius (R3) that is smaller than the second radius R2; and a portion to be urged (a portion that includes the pressed surface 26*g* (26Ig and the like) and the fixed part 26*h* (26*h*1-26*h*3 and the like)) that has a shape that includes a discoidal shape, which is centered on the first axis and has a fourth radius (R4) that is smaller than the first radius R1 and larger than the third radius R3; in addition, the base member has the groove part 26*d* (or the fluid paths 26Pd, 26Qd and the like) that serves as a solid body structure, which is for increasing the surface area of the shaft part 26*b* that contacts the air (atmospheric gas), at the outer circumference or in the vicinity of the shaft part 26*b*.

In this case, the shaft part 26*b* and, in turn, the relevant discharge lamp can be efficiently cooled by supplying cooled gas (or liquid) from the ventilating apparatus 71 in FIG. 9 through the vent 50*c* of the positioning plate 50 in FIG. 3 to the circumference or the interior of that solid structure.

In this case, the fact that the flange part 26*a* and the like as well as the portions to be urged have shapes that include a discoidal shape means that at least a portion of their outer surfaces inscribes the discoidal shape and that through holes (including screw holes) or open holes and the like may be formed therein. In addition, the fact that the shaft part 26*b* is circumscribed by its columnar shape means that the shaft part 26*b* has a shape that does not extend beyond that columnar shape in the radial direction and that a external shape edge (outer side surface) of the shaft part 26*b* is circumscribed by the side surface of that columnar shape at a plurality of locations. In addition, the fact that the solid structure enlarges the area of the surface of the shaft part 26*b* that contacts the air means that that surface area is larger than the side surface of the columnar shape, which has the radius R2. In that case, when that solid structure comprises the fluid paths 26Pd, 26Qd that are provided in the shaft part 26*b*, the fact that that solid structure enlarges the area of the surface of the shaft part 26*b* that contacts the air means that the sum of the surface area of the side surface of the shaft part 26*b* and the surface areas of the inner surfaces of the fluid paths 26Pd, 26Qd is greater than the surface area of the side surface of the columnar shape, which has the radius R2.

In addition, if the solid structure is one wherein the outer circumference of the shaft part 26*b* has an irregular shape—as in the helical groove part 26*d* in FIG. 2A, the groove parts 26Cd in the vertical direction in FIG. 1C, and the numerous protruding parts 26*n* in FIG. 15B—then the structure is easy to fabricate.

In addition, if the solid structure comprises fluid paths that are provided in the interior of the shaft part 26*b*, as in the fluid paths 26Pd, 26Qd in FIGS. 15C, 15D, then the contact surface area between the shaft parts 26*b* of the base parts 26P, 26Q of the discharge lamps 1P, 1Q and the cylindrical member 52 of the mounting apparatus 31 in FIG. 3 can be increased, the base parts 26P, 26Q can thereby be held more stably, and the discharge lamps 1P, 1Q can be cooled more efficiently.

In addition, as shown in FIGS. 15C, 15D, the openings P1, P2 and the openings Q1, Q2 communicate with the fluid paths 26Pd, 26Qd, respectively, and if the openings P1, Q1 and openings P2, Q2 are formed on the outer side surface of the shaft part 26*b* in the vicinity of the flange part 26*a* and in the vicinity of the end part of the shaft part 26*b* on the small diameter part 26*k* side, respectively, then it is possible to cool substantially the entire shaft part 26*b* efficiently from the flange part 26*a* to the recessed part 26*f*.

Furthermore, when either of the discharge lamps is mounted to the mounting apparatus 31, the solid structure discussed above can be said to be a cooling part that is contacted by the cooling medium (e.g., gas). This cooling part is not limited to the solid structure and, as shown by the rod part 26b2 in FIG. 18A, includes one that is formed with a diameter that is smaller than that of the shaft portion 26b1, which serves as the mating part, and that has a gently sloped surface.

Furthermore, the discharge lamp 1 and the discharge lamps 1A-1Q in FIGS. 2A-2C, FIG. 11A through FIG. 16C, and FIGS. 18A-18B are each provided with the glass tube 25 (or 25A), which is formed so that it extends in the longitudinal direction, and the base part 26 (or 26A-26Q), one end part of which is coupled to an end part of the glass tube 25 (or 25A) on the longitudinal direction side. Furthermore, it can be said that the flange part 26a, which is provided to the base part 26 (or 26A-26Q), is formed protrusively in the directions that are orthogonal to the longitudinal direction. In addition, the mating part 26b is provided between the flange part 26a and the open end of the base part 26 (or 26A-26Q) (because the end part that is coupled to the glass tube 25 (or 25A) is defined as the one end part, the open end herein can be said to be the other end), and it can be said that its external shape in the direction that are orthogonal to the longitudinal direction is smaller than that of the flange part 26a. Furthermore, in the present embodiment, the external shape of the flange part 26a in the direction that are orthogonal to the longitudinal direction is circular, and the external shape of the mating part 26b is also circular.

In addition, the small diameter part 26k is provided between the flange part 26a and the open end of the base part 26, and it can be said that it has a shape wherein its external shape is smaller than that of the mating part 26b in the direction that is orthogonal to the longitudinal direction. In addition, the fixed part 26h is provided between the flange part 26a and the open end of the base part 26, and it can be said that it has a shape wherein its external shape is smaller than that of the flange part 26a and larger than that of the small diameter part 26k in the direction that is orthogonal to the longitudinal direction. In addition, the projection exposure apparatus of the abovementioned embodiment can be manufactured by: incorporating the exposure light source, the illumination optical system, which comprises a plurality of lenses and the like, and a projection optical system in an exposure apparatus main body, and then optically adjusting such; attaching the reticle stage, the wafer stage, and the like, each of which comprise numerous machine parts, to the exposure apparatus main body and then wiring and piping them; and performing an overall adjustment (electrical adjustment, operation verification, and the like). Furthermore, it is preferable to manufacture the projection exposure apparatus in a clean room in which the temperature, the cleanliness level, and the like are controlled.

According to the present invention, it is possible to easily remove and mount the discharge lamp from and to the mounting apparatus 31 (holding apparatus) in a short period of time merely by the switching link mechanism 63 (switching mechanism) of the mounting apparatus 31 releasing the pressing applied by the fixing arms (urging member) thereof to the fixed part 26h (urged part) of the discharge lamp 1. In addition, the discharge lamp is easily pressed and fixed to the mounting apparatus 31 with a substantially constant pressing force within the target range due to the urging force merely by the switching link mechanism 63 commencing the pressing by the fixing arms against the fixed part 26h in one of the movement directions. In addition, when cooling gas is supplied from the ventilating apparatus, the gas flows along the surface of the base part toward the fixed part 26h side, which makes it possible to efficiently cool the discharge lamp 1 with a simple mechanism. In addition, a microdevice, such as a semiconductor device, is manufactured by, for example: a step that designs the functions and performance of the microdevice; a step that fabricates a mask (reticle) based on the designing step; a step that fabricates a substrate, which is the base material of the device; a substrate processing step that includes, for example, a process that exposes the pattern of the reticle onto the substrate (wafer and the like) by using the exposure apparatus of the embodiments discussed above, a process that develops the exposed substrate, and a process that heats (cures) and etches the developed substrate; a device assembling step (including dicing, bonding, and packaging processes); and an inspecting step.

Figure 19:
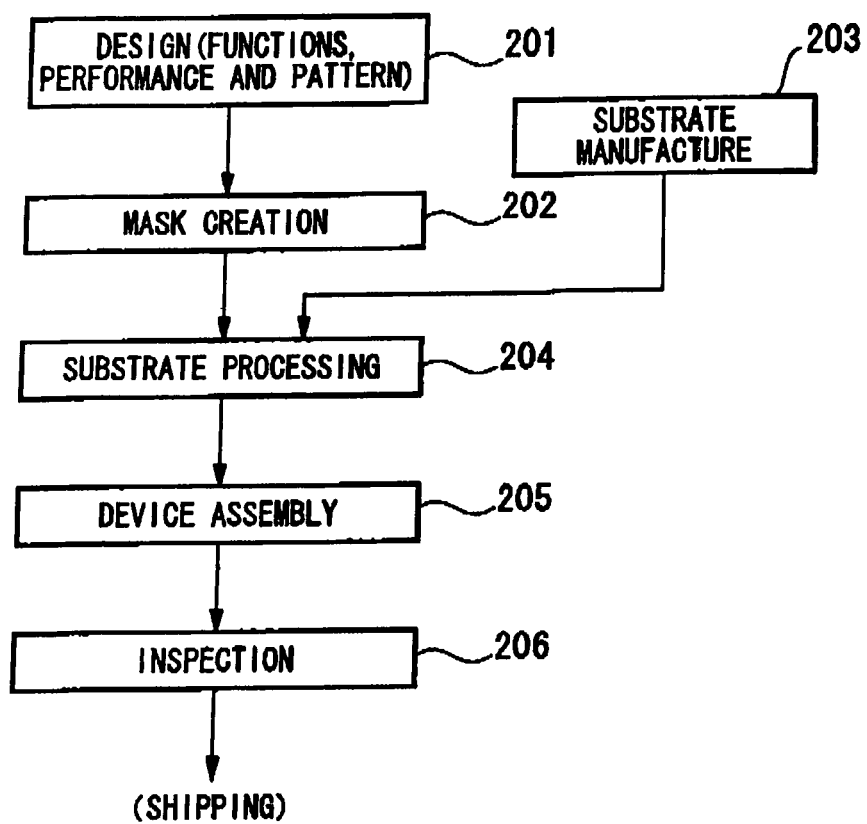
FIG. 19 is a flow chart diagram that shows one example of the process of fabricating a microdevice.

In the case in which micro devices are manufactured by means of the exposure apparatus according to the above-described embodiments, as shown in FIG. 19, micro devices such as semiconductor devices are manufactured through a step 201 of designing the function and performance of a micro device, a step 202 of fabricating a mask (reticle) on the basis of the designing step, a step 203 of fabricating a substrate that is a device base material, a step 204 including substrate processing processes, such as a process of exposing a pattern on the mask onto a substrate by means of the exposure apparatus EX of the aforementioned embodiments, a process of developing the exposed substrate, and a process of heating (curing) and etching the developed substrate, a device assembly step 205 (including processing processes, such as a dicing process, a bonding process, and a packaging processing), and an inspection step 206.

Furthermore, the light source apparatus of the present invention can also be adapted to the exposure light source of the abovementioned step-and-repeat projection exposure apparatus (such as a stepper) as well as a step-and-scan scanning exposure type projection exposure apparatus (such as a scanning stepper). In addition, the light source apparatus of the present invention can also be adapted to the exposure light source of a liquid immersion type exposure apparatus as disclosed in, for example, PCT International Publication WO99/49504 and PCT International Publication WO2004/019128. In addition, the light source apparatus of the present invention can also be adapted to a light source apparatus of a proximity type or a contact type exposure apparatus, which do not use a projection optical system, or to the light source of equipment other than exposure apparatuses.

Furthermore, the embodiments discussed above use a reticle (mask) wherein a transfer pattern is formed, but an electronic mask may be used instead wherein a transmittance pattern or a reflected pattern is formed based on electronic data of the pattern to be exposed, as disclosed in, for example, U.S. Pat. No. 6,778,257.

In addition, the type of exposure apparatus is not limited to a semiconductor device fabrication exposure apparatus, but can also be adapted widely to an exposure apparatus that is used for fabricating displays, such as liquid crystal devices and plasma displays, and that transfers a device pattern onto a glass plate, an exposure apparatus that is used in the fabrication of thin film magnetic heads and that transfers a device pattern onto a ceramic wafer, and an exposure apparatus that is used for fabricating, for example, imaging devices (CCDs), OLEDs, micromachines, MEMS (microelectromechanical systems), and DNA chips. In addition to microdevices, such as semiconductor devices, the present invention can also be adapted to an exposure apparatus that transfers a circuit pattern to, for example, a glass substrate or a silicon wafer in order to fabricate a mask that is used by a light exposure apparatus, an EUV exposure apparatus, or the like.

Thus, the present invention is not limited to the embodiments discussed above, and it is understood that variations and modifications may be effected without departing from the spirit and scope of the invention. For example, the shape of the pressed surface of the fixed part 26*h* in FIGS. 13A, 13B, 13C can be adapted to various other discharge lamps.

According to the light source apparatus of the present invention, it is possible to, for example, mount the discharge lamp to the holding apparatus (mounting mechanism) easily and in a short period of time. In addition, the discharge lamp can be cooled efficiently with a simple mechanism, which is preferable in an exposure light source of an exposure apparatus and the like.

What is claimed is:

1. A discharge lamp, comprising:
    a glass member that comprises a light emitting part and that is formed so that it extends in a first direction; and
    a first base member having one end part that is coupled to an end part of the glass member on the first direction side; wherein
    the first base member comprises:
        a projecting part which is provided to one end part side of the first base member that protrudes in an orthogonal direction, which is orthogonal to the first direction;
        a first shaft part, which is provided between the projecting part and another end part of the first base member, the external shape of which is smaller than that of the projecting part in the orthogonal direction;
        a second shaft part, which is provided between the first shaft part and the other end part of the first base member, the external shape of which is smaller than that of the first shaft part in the orthogonal direction;
        a third shaft part, which is provided to the other end part side of the first base member, the external shape of which is smaller than that of the projecting part and larger than that of the second shaft part in the orthogonal direction; and
        a recessed part that is provided to at least part of an outer circumferential surface of the first shaft part and that is formed by a groove part that extends from the one end part side to the other end part side of the first base member, the recessed part fluidly or thermally communicates with one end part side of the first shaft part and a space between the first shaft part and the third shaft part.

2. A discharge lamp according to claim 1, wherein the first shaft part is formed in the shape of a column that extends in the first direction.

3. A discharge lamp according to claim 1, wherein in sequence from the one end part to the other end part, the first base member comprises:
    the projecting part;
    a first portion of the first shaft part;
    a second portion of the first shaft part;
    the second shaft part; and
    the third shaft part.

4. A discharge lamp according to claim 1, wherein the third shaft part has an external shape that is the same as or smaller than that of the first shaft part in the orthogonal direction.

5. A discharge lamp according to claim 1, wherein the third shaft part comprises a surface that is formed on the glass member side.

6. A discharge lamp according to claim 5, wherein the surface is in a plane that is orthogonal to the first direction.

7. A discharge lamp according to claim 5, wherein the surface is in a plane that is inclined with respect to the plane that is orthogonal to the first direction.

8. A discharge lamp according to claim 1, wherein the groove part is formed helically around an axis that extends in the first direction.

9. A discharge lamp according to claim 1, wherein the groove part is formed in the first direction.

10. A discharge lamp according to claim 1, wherein the recessed part is formed by an irregular shape that is provided to at least part of the outer circumferential surface of the first shaft part.

11. A discharge lamp according to claim 1, wherein the projecting part is annularly formed.

12. A discharge lamp according to claim 1, wherein the projecting part comprises a plurality of openings, each of which extends in the first direction.

13. A discharge lamp according to claim 1, wherein the projecting part comprises a plurality of grooves, each of which extends in the first direction.

14. A discharge lamp according to claim 1, comprising:
    a second base member that, with respect to the first base member, is provided on the opposite side of the glass member in the first direction, and that, along with the first base member, sandwiches the glass member; wherein,
    the second base member comprises a recessed part that fluidly or thermally communicates with one end part side of the second base member and another end part side of the second base member.

15. A discharge lamp according to claim 1, comprising:
    the second base member that with respect to the first base member, is provided on the opposite side of the glass member in the first direction, and that, along with the first base member, sandwiches the glass member; wherein,
    the second base member comprises a helical groove part that is formed around the axis in the first direction.

16. A discharge lamp according to claim 14, wherein the second base member comprises a cover that covers the recessed part.

17. A discharge lamp according to claim 14, wherein:
    the recessed part of the second base member is formed by a groove part that extends from the one end part side to the other end part side of the second base member.

18. A discharge lamp according to claim 17, wherein the groove part is formed helically around an axis that extends in the first direction.

19. A discharge lamp according to claim 15, wherein the second base member comprises a cover that covers the helical groove part.

20. A discharge lamp, comprising:
    a glass member that comprises a light emitting part and that is formed so that it extends in a first direction; and
    a first base member having one end part that is coupled to an end part of the glass member on the first direction side; wherein
    the first base member comprises:
        a projecting part which is provided to one end part side of the first base member that protrudes in an orthogonal direction, which is orthogonal to the first direction;
        a first shaft part, which is provided between the projecting part and another end part of the first base member, the external shape of which is smaller than that of the projecting part in the orthogonal direction;

a second shaft part, which is provided between the first shaft part and the other end part of the first base member, the external shape of which is smaller than that of the first shaft part in the orthogonal direction;

a third shaft part, which is provided to the other end part side of the first base member, the external shape of which is smaller than that of the projecting part and larger than that of the second shaft part in the orthogonal direction; and a recessed part that is provided to at least part of an outer circumferential surface of the first shaft part and that fluidly or thermally communicates with one end part side of the first shaft part and a space between the first shaft part and the third shaft part, wherein the third shaft part comprises a plurality of protruding parts, each of which protrudes in the orthogonal direction.

21. A discharge lamp, comprising:

a glass member that comprises a light emitting part and that is formed so that it extends in a first direction; and a first base member having one end part that is coupled to an end part of the glass member on the first direction side; wherein the first base member comprises:

a projecting part which is provided to one end part side of the first base member that protrudes in an orthogonal direction, which is orthogonal to the first direction;

a first shaft part, which is provided between the projecting part and another end part of the first base member, the external shape of which is smaller than that of the projecting part in the orthogonal direction;

a second shaft part, which is provided between the first shaft part and the other end part of the first base member, the external shape of which is smaller than that of the first shaft part in the orthogonal direction;

a third shaft part, which is provided to the other end part side of the first base member, the external shape of which is smaller than that of the projecting part and larger than that of the second shaft part in the orthogonal direction; and a recessed part that is provided to at least part of an outer circumferential surface of the first shaft part and that fluidly or thermally communicates with one end part side of the first shaft part and a space between the first shaft part and the third shaft part, wherein the first shaft part and the second shaft part each have a circular cross section that is centered on an axis that is parallel to the first direction; and the diameter of the second shaft part is less than one-half that of the first shaft part.

22. A discharge lamp, comprising:

a glass member that comprises a light emitting part and that is formed so that it extends in a first direction; and a first base member having one end part that is coupled to an end part of the glass member on the first direction side; wherein the first base member comprises:

a projecting part which is provided to one end part side of the first base member that protrudes in an orthogonal direction, which is orthogonal to the first direction;

a first shaft part, which is provided between the projecting part and another end part of the first base member, the external shape of which is smaller than that of the projecting part in the orthogonal direction;

a second shaft part, which is provided between the first shaft part and the other end part of the first base member, the external shape of which is smaller than that of the first shaft part in the orthogonal direction;

a third shaft part, which is provided to the other end part side of the first base member, the external shape of which is smaller than that of the projecting part and larger than that of the second shaft part in the orthogonal direction; and a recessed part that is provided to at least part of an outer circumferential surface of the first shaft part and that fluidly or thermally communicates with one end part side of the first shaft part and a space between the first shaft part and the third shaft part, wherein the glass member comprises a rod shaped part that is coupled with the first base member; and the diameter of the first shaft part is subsequently the same as that of the rod shaped part.

23. A discharge lamp, comprising:

a glass member that comprises a light emitting part and that is formed so that it extends in a first direction; and a first base member having one end part that is coupled to an end part of the glass member on the first direction side; wherein the first base member comprises:

a projecting part which is provided to one end part side of the first base member that protrudes in an orthogonal direction, which is orthogonal to the first direction;

a first shaft part, which is provided between the projecting part and another end part of the first base member, the external shape of which is smaller than that of the projecting part in the orthogonal direction;

a second shaft part, which is provided between the first shaft part and the other end part of the first base member, the external shape of which is smaller than that of the first shaft part in the orthogonal direction;

a third shaft part, which is provided to the other end part side of the first base member, the external shape of which is smaller than that of the projecting part and larger than that of the second shaft part in the orthogonal direction; and a recessed part that is provided to at least part of an outer circumferential surface of the first shaft part and that fluidly or thermally communicates with one end part side of the first shaft part and a space between the first shaft part and the third shaft part, wherein the length of the first base member in the first direction is greater than or equal to $1/5$ and is less than $1/4$ the overall length of the discharge lamp.

* * * * *